United States Patent
Dasgupta et al.

(10) Patent No.: US 9,640,422 B2
(45) Date of Patent: May 2, 2017

(54) III-N DEVICES IN SI TRENCHES

(71) Applicant: Intel Corporation, Santa Clara, CA (US)

(72) Inventors: Sansaptak Dasgupta, Hillsboro, OR (US); Han Wui Then, Portland, OR (US); Sanaz K. Gardner, Hillsboro, OR (US); Seung Hoon Sung, Portland, OR (US); Marko Radosavljevic, Beaverton, OR (US); Benjamin Chu-Kung, Portland, OR (US); Sherry R. Taft, Sherwood, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/162,717

(22) Filed: Jan. 23, 2014

(65) Prior Publication Data

US 2015/0206796 A1    Jul. 23, 2015

(51) Int. Cl.
*H01L 21/44*  (2006.01)
*H01L 21/762*  (2006.01)
*H01L 21/02*  (2006.01)

(52) U.S. Cl.
CPC .... *H01L 21/76232* (2013.01); *H01L 21/0254* (2013.01); *H01L 21/02381* (2013.01); *H01L 21/02458* (2013.01); *H01L 21/02639* (2013.01); *H01L 21/02647* (2013.01); *H01L 21/76229* (2013.01)

(58) Field of Classification Search
CPC .......... H01L 21/0254; H01L 21/76229; H01L 21/76232
USPC .......................................... 438/680
See application file for complete search history.

(56) References Cited

U.S. PATENT DOCUMENTS

| | | | |
|---|---|---|---|
| 2003/0092230 A1* | 5/2003 | Koike | H01L 21/0237 438/200 |
| 2006/0084245 A1 | 4/2006 | Kohda | |
| 2007/0164269 A1 | 7/2007 | Okuyama | |
| 2007/0281446 A1 | 12/2007 | Winstead et al. | |
| 2010/0044719 A1 | 2/2010 | Yu et al. | |
| 2010/0068866 A1 | 3/2010 | Yu et al. | |

OTHER PUBLICATIONS

International Search Report and Written Opinion of the International Searching Authority, PCT/US2014/070085, Mailed Apr. 17, 2015, 14 pages.

(Continued)

*Primary Examiner* — Ajay K Arora
(74) *Attorney, Agent, or Firm* — Blakely, Sokoloff, Taylor & Zafman LLP

(57) ABSTRACT

A trench comprising a portion of a substrate is formed. A nucleation layer is deposited on the portion of the substrate within the trench. A III-N material layer is deposited on the nucleation layer. The III-N material layer is laterally grown over the trench. A device layer is deposited on the laterally grown III-N material layer. A low defect density region is obtained on the laterally grown material and is used for electronic device fabrication of III-N materials on Si substrates.

14 Claims, 16 Drawing Sheets

(56) References Cited

OTHER PUBLICATIONS

NPL1 Taiwan (R.O.C.) Patent Application No. 103143329, Office Action and Taiwan IPO Search Report (with English translation), dated Nov. 27, 2015 (14 pages).
PCT Notification concerning Transmittal of International Preliminary Report on Patentability (Chapter 1 of the Patent Cooperation Treaty), PCT/US2014/070085, Mailed Aug. 4, 2016, 14 pages.

* cited by examiner

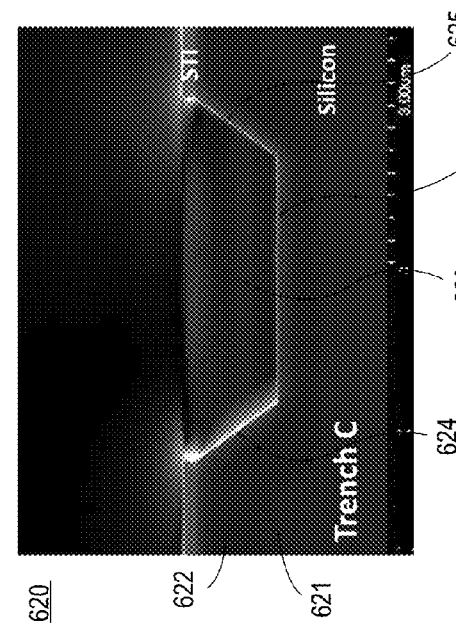

III-N DEVICES IN SI TRENCHES

FIELD

Embodiments as described herein relate to the field of electronic systems manufacturing, and in particular, to manufacturing III-N material based devices.

BACKGROUND

Typically, III-N material based transistors are used for high voltage and high frequency applications. III-N material based devices may be candidates for system-on-chips ("SoCs") applications, for example for power management integrated circuits ("ICs") and radio frequency ("RF")-power amplifiers. Generally, co-integration of III-N material based devices with a silicon ("Si") substrate however is a great challenge due to dissimilar properties of the III-N materials and silicon. For example, the lattice mismatch between a GaN material and a Si wafer along <100> crystallographic orientation is about 41%. A large lattice mismatch between the III-N material and silicon typically results in high defect densities in the III-N material grown on Si. For example, the mismatch in thermal expansion coefficient between GaN and Si is about 116%. A large mismatch in thermal expansion coefficient between the III-N material and Si typically results in surface cracks on the III-N material grown on Si. These defects significantly reduce the mobility of carriers (e.g., electrons, holes, or both) in the III-N materials and can also result in poor yield and reliability issues Currently, growth of the III-N material on Si (100) wafer requires thick and complex buffer layers. Typically, the III-N material is formed on the thick and complex buffer layers by a blanket epitaxial growth process over the entire Si wafer. The blanket epitaxial growth process is not selective area or pattern specific. The blanket approach does not allow for co-integration of both Si Complementary Metal Oxide Semiconductor ("CMOS") circuits and III-N based devices side by side on the die. Additionally, the growth of the thick and complex buffer layers requires a lot of time that may not be suitable for high volume production.

As such, the existing techniques do not provide a pathway for co-integration of both III-N transistors and Si Complementary Metal Oxide Semiconductor ("CMOS") circuits.

BRIEF DESCRIPTION OF THE DRAWINGS

Embodiments of the invention may best be understood by referring to the following description and accompanying drawings that are used to illustrate embodiments of the invention. In the drawings:

FIG. 6A shows a scanning electron microscope ("SEM") image of a type a trench according one embodiment.

FIG. 6B shows a SEM image of a type B trench according one embodiment.

FIG. 6C shows a SEM image of a type C trench according one embodiment.

FIG. 6D shows a SEM image of a type D trench according one embodiment.

DETAILED DESCRIPTION

Figure 1:
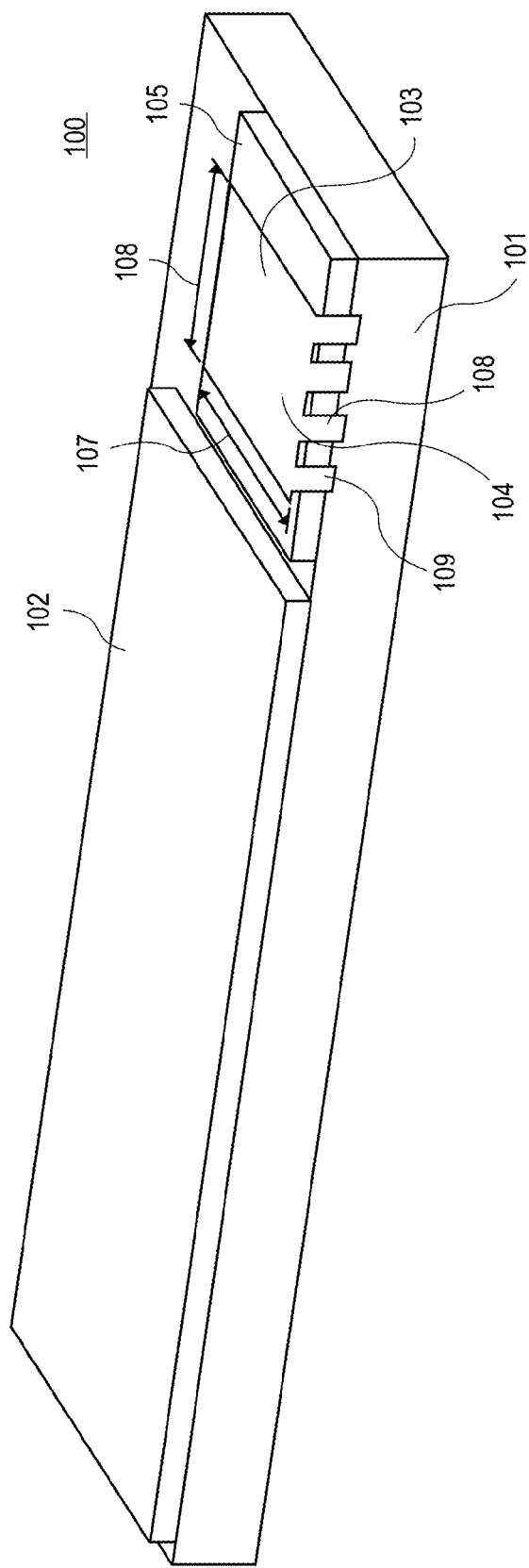
FIG. 1 shows a three dimensional ("3D") view of an electronic device structure 100 according to one embodiment.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Methods and apparatuses to manufacture an electronic device are described herein. A trench comprising a portion of a substrate is formed. A nucleation layer is deposited on the portion of the substrate within the trench. A III-N material layer is deposited on the nucleation layer. The III-N material layer is laterally grown over the trench. A device layer is deposited on the laterally grown III-N material layer. Methods described herein provide co-integration of III-N devices (e.g., transistors, and other III-N based devices) for power management integrated circuits ("PMIC") and RF power amplifier ("PA") applications in close proximity with Si Complementary Metal Oxide Semiconductor ("CMOS") circuits for system on chip ("SoC") products.

Generally, the III-N material refers to a compound semiconductor material that comprises at least one of group III elements of the periodic table, e.g., aluminum ("Al"), gallium ("Ga"), indium ("In"), and nitrogen ("N"). In at least some embodiments, the substrate includes silicon, and the III-N layer includes GaN.

In at least some embodiments, an electronic device, e.g., a transistor, or any other electronic device comprising an epitaxially grown III-Nitride ("N") material is grown using nanoscale trenches created on a Si wafer substantially aligned along (100) crystallographical plane ("Si (100)").

At least some embodiments described herein present options for hetero-integration of III-N devices with Si CMOS as opposed to growth of the blanket III-N layer on the buffer layers on Si wafers.

In at least some embodiments, trenches are formed on a Si (100) substrate. A III-N material is vertically grown on the portions of the substrate within the trenches. The III-N material is then grown laterally out of the trenches. The portions of the laterally grown III-N material are merged into large (e.g., at least about 50 microns ("µm")) islands of the III-N material over a Si substrate. In at least some embodiments, one or more device layers are grown on the III-N material island to fabricate III-N material based devices. The III-N material island housing a plurality of III-N material based devices is created.

Embodiments described herein advantageously provide hetero-integration of III-N material based devices with Si CMOS while mitigating defect density and surface cracks. In at least some embodiments, the trenches for forming the III-N material islands are narrow and have low depth that advantageously reduces the III-N material growth time resulting in reduction of the manufacturing cost.

FIG. 1 shows a three dimensional ("3D") view of an electronic device structure 100 according to one embodiment. As shown in FIG. 1, the electronic device structure 100 comprises a silicon Complementary Metal Oxide Semiconductor ("CMOS") circuit portion 102 and a III-N material based devices portion 103 on a substrate 101. In an embodiment, substrate 101 is one of the substrates described in further detail below.

The III-N material based devices are formed on III-N material islands, such as a III-N material island 104. The III-N material islands are formed on a trench layer, such as a trench layer 105 deposited at predetermined locations on substrate 101 depending on a circuit layout. In at least some embodiments, the locations for the III-N islands are determined within a Si CMOS wafer prior to Si CMOS processing. In an embodiment, electronic device structure 100 is a part of a SoC.

As shown in FIG. 1, a plurality of trenches, such as trenches 108 and 109 are formed in a trench layer 105 on the substrate 101. A III-N material layer is formed in the trenches. The III-N material layer extends laterally over the trenches forming a planar III-N material island 104. In an embodiment, the III-N material layer is formed on a nucleation layer (not shown) deposited in the trench. As shown in FIG. 1, III-N island 104 has a length 105 and a width 106. In an embodiment, the length of the III-N island is at least 50 microns ("μm"), and the width of the III-N island is at least 50 μm. In more specific embodiment, each of the length and width of the III-N island is from about 50 μm to about 500 μm. III-N material island 104 can have a square, a rectangular, an oval, a circular, a polygon, or any other shape.

Depending on the circuit layout, III-N material islands are embedded into a Si substrate. These III-N islands house one or more III-N electronic devices. In an embodiment, the III-N material islands are created by forming trenches with shallow trench insulating ("STI") (e.g., oxide) layer sidewalls. One or more III-N material layers are epitaxially grown out of these trenches. These III-N material layers are then laterally merged into an island of III-N material, upon which one or more III-N material based device layers are grown and the III-N material based electronic devices (e.g., transistors, capacitors, power management integrated circuits, RF power amplifiers, or any other III-N material based devices) are fabricated, as described in further detail below.

Figure 2A:
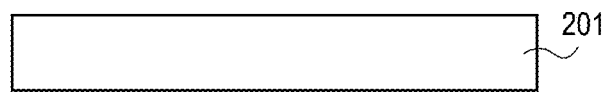
FIG. 2A shows a side view of an electronic device structure according to one embodiment.

FIG. 2A shows a side view 200 of an electronic device structure according to one embodiment. The electronic device structure comprises a substrate 201. In an embodiment, the substrate 201 is a substrate substantially aligned along a predetermined crystal orientation. Generally, the crystallographic orientations (e.g., (100), (111), (110), and other crystallographical orientations) are known to one of ordinary skill in the art of electronic device manufacturing. In an embodiment, the substrate 201 includes a semiconductor material, e.g., monocrystalline silicon ("Si"), germanium ("Ge"), silicon germanium ("SiGe"), a III-V materials based material e.g., gallium arsenide ("GaAs"), or any combination thereof. In one embodiment, the substrate 201 includes metallization interconnect layers for integrated circuits. In at least some embodiments, the substrate 201 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 201 includes interconnects, for example, vias, configured to connect the metallization layers.

In an embodiment, substrate 201 is a semiconductor-on-isolator (SOI) substrate including a bulk lower substrate, a middle insulation layer, and a top monocrystalline layer substantially aligned along a predetermined crystal orientation, for example, (100) crystal plane. The top monocrystalline layer may comprise any material listed above, e.g., silicon. In an embodiment, substrate 201 is a silicon substrate substantially aligned along a (100) crystal plane ("Si (100)") with zero degree miscut. In an embodiment, substrate 201 a Si (100) substrate with a miscut of a predetermined degree (e.g., 2-10°) towards the [110] crystallographical direction to facilitate III-N material nucleation.

Figure 2B:
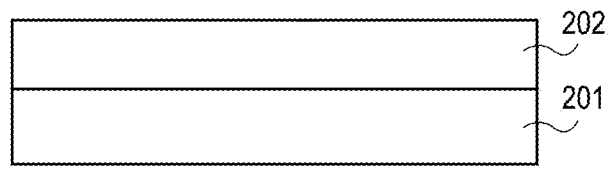
FIG. 2B is a view similar to FIG. 2A, after an insulating layer is deposited on a substrate according to one embodiment.

FIG. 2B is a view 210 similar to FIG. 2A, after an insulating layer 202 is deposited on substrate 201 according to one embodiment. In an embodiment, insulating layer 202 is a nitride layer, e.g., silicon nitride ("SiN") layer. In an embodiment, insulating layer 202 is a silicon oxide (e.g. $SiO_2$) layer, aluminum oxide ("Al2O3"), silicon oxide nitride ("SiON"), other oxide/nitride layer, any combination thereof, or other electrically insulating layer determined by an electronic device design. In an embodiment, insulating layer 202 is deposited using one of blanket deposition techniques, such as but not limited to a chemical vapour deposition ("CVD"), e.g., a plasma Enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other blanket deposition techniques known to one of ordinary skill in the art of electronic device manufacturing. In an embodiment, the thickness of the insulating layer 202 is from about 50 nanometers ("nm") to about 250 nm.

Figure 2C:
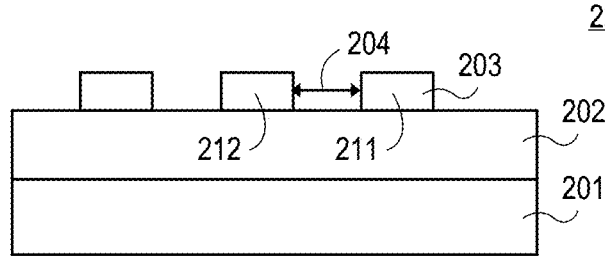
FIG. 2C is a view similar to FIG. 2b, after the insulating layer is patterned according to one embodiment.

FIG. 2C is a view 220 similar to FIG. 2B, after insulating layer 202 is patterned according to one embodiment. As shown in FIG. 2C, a mask layer 203 is deposited on insulating layer 202. Mask layer 203 comprises features, such as a feature 211 and a feature 212 separated by a distance 204. In at least some embodiments, the distance between the features of the mask layer 203 sets the width of the trench formed later in a process.

In an embodiment, mask layer 203 comprises a photoresist, a hard mask, or a combination thereof. In at least some embodiments, the hard mask deposited on insulating layer 202 comprises an aluminum oxide (e.g., $Al_2O_3$); polysilicon, amorphous Silicon, poly germanium ("Ge"), a refractory metal (e.g., tungsten ("W"), molybdenum ("Mo"), other refractory metal, or any combination thereof. Mask layer 203 can be patterned using one of patterning and etching techniques known to one of ordinary skill in the art of electronic device manufacturing.

Figure 2D:
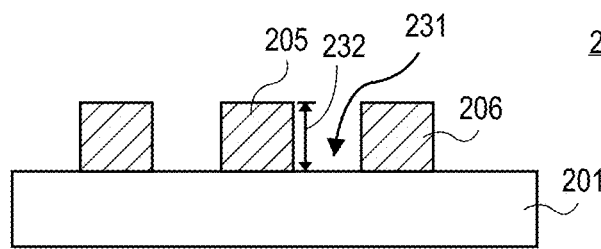
FIG. 2D is a view similar to FIG. 2C, after etching the patterned insulating layer and removing the mask layer according to one embodiment.

FIG. 2D is a view 230 similar to FIG. 2C, after etching the patterned insulating layer 202 and removing the mask layer according to one embodiment. As shown in FIG. 2D, insulating layer 202 is etched through the patterned mask layer 203 to expose portions, such as a portion 231 of the substrate 201 and create blocks, such as a block 205 and a block 206. In an embodiment, insulating layer 202 is etched using one of a wet etching, dry etching, or both dry and wet etching techniques known to one of ordinary skill in the art of electronic device manufacturing. In an embodiment, insulating layer 202 of silicon nitride is wet etched using e.g HF solution, buffered HF solution, or other wet etch chemistry. Mask layer 203 can be removed from insulating layer 202, for example, using a polishing process, such as a chemical-mechanical planarization ("CMP") process as known to one of ordinary skill in the art of electronic device manufacturing. If the mask layer 203 is a photoresist, it can be removed in organic solvents (e.g. acetone) post 205 and 206 block formation.

In an embodiment, the height of the blocks, such as a height 232 sets the thickness of a trench layer formed later in a process. In an embodiment, height of the blocks, such as a height 232 is from about 50 nm to about 250 nm.

Figure 2E:
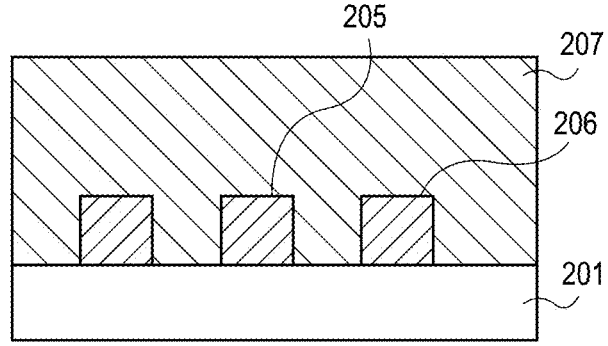
FIG. 2E is a view similar to FIG. 2D after a trench layer is deposited on the exposed portions of the substrate according to one embodiment.

FIG. 2E is a view 240 similar to FIG. 2D after a trench layer 207 is deposited on the exposed portions of the substrate according to one embodiment. As shown in FIG. 2E, trench layer 207 is deposited over blocks 205 and 206. In an embodiment, trench layer 207 is an insulating layer suitable to insulate adjacent devices and prevent leakage. In one embodiment, trench layer 207 is an oxide layer, e.g., silicon oxide, or any other electrically insulating layer determined by an electronic device design. In an embodiment, trench layer 207 is a silicon oxide (e.g. SiO2) layer, a silicon nitride layer, aluminum oxide ("$Al_2O_3$"), silicon oxide nitride ("SiON"), other oxide/nitride layer, any combination thereof, or other electrically insulating layer determined by an electronic device design. In one embodiment, trench layer 207 comprises an interlayer dielectric (ILD), e.g., silicon dioxide. In one embodiment, trench layer 207 may include polyimide, epoxy, photodefinable materials, such as benzocyclobutene (BCB), and WPR-series materials, or spin-on-glass. In one embodiment, trench layer 207 is a low permittivity (low-k) ILD layer. Typically, low-k is referred to the dielectrics having dielectric constant (permittivity k) lower than the permittivity of silicon dioxide.

In one embodiment, trench layer 207 is a shallow trench isolation (STI) layer to provide field isolation regions. In another embodiment, trench layer 207 is a metallic layer, e.g., a tungsten ("W"), molybdenum ("Mo"), or any other metal layer.

In one embodiment, trench layer 207 is deposited to at least the same thickness as the thickness of the blocks 205 and 206. In one embodiment, trench layer 207 is deposited to the thickness from about 50 nm to about 500 nm. The trench layer 207 can be blanket deposited using any of techniques known to one of ordinary skill in the art of electronic device manufacturing, such as but not limited to a chemical vapour deposition (CVD), and a physical vapour deposition (PVD).

Figure 2F:
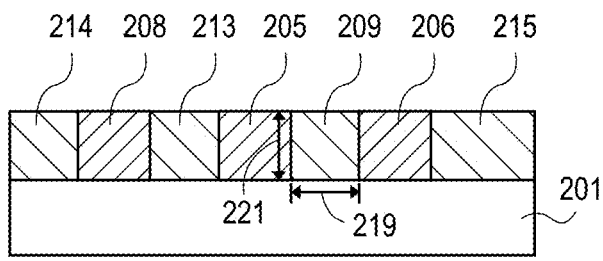
FIG. 2F is a view similar to FIG. 2E after a top portion of the trench layer is removed to expose the insulating layer blocks according to one embodiment.

FIG. 2F is a view 250 similar to FIG. 2E after a top portion of the trench layer is removed to expose the insulating layer blocks according to one embodiment. As shown in FIG. 2F, the trench layer 207 is removed so that the top surfaces of the insulating layer blocks, such as blocks 205, 206, and 208 are exposed. Blocks of the trench layer 207, are deposited on the substrate 201 between the insulating layer blocks to form trench sidewall blocks 209, 213, 214, and 215. The height of sidewall blocks 209, 213, 214, and 215 is substantially the same as the height of the blocks 205, 206, and 208, as shown in FIG. 2F. Trench sidewall block 209 has a width 219 and a height 221, as shown in FIG. 2F. In an embodiment, the width of the trench sidewall block is determined by a dimension of the III-N material island formed later in a process. In an embodiment, the trench sidewall block width is from about 50 nm to about 1 µm. In an embodiment, the height of the trench sidewall block determines the depth of the trench formed later on in a process. In an embodiment, the height of the trench sidewall block is from about 50 nm to about 250 nm.

The top portion of the trench layer 207 can be removed, for example, using a polishing process, such as a chemical-mechanical planarization ("CMP") process as known to one of ordinary skill in the art of electronic device manufacturing.

Figure 2G:
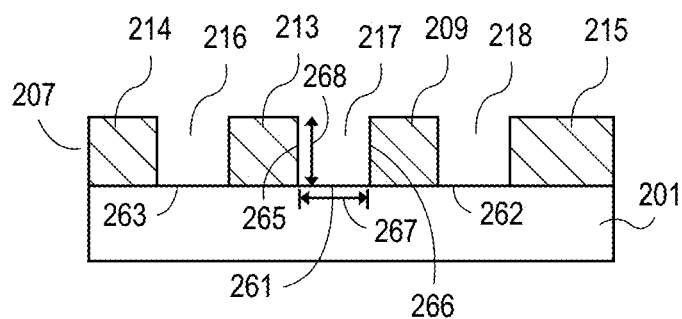
FIG. 2G is a view similar to FIG. 2F, after the insulating layer blocks are removed to form trenches according to one embodiment.

FIG. 2G is a view 260 similar to FIG. 2F, after the insulating layer blocks are removed to form trenches according to one embodiment. As shown in FIG. 2G, trenches such as a trench 216, 217 and 218 are formed in trench layer 207. The insulating layer is removed to expose portions of the substrate 261, 262, and 263. As shown in FIG. 2G, trench 217 has a bottom portion and opposing sidewalls 265 and 266. The bottom portion of the trench 217 is portion 261 of the substrate 201. Trench has opposing sidewalls 265 and 266. The sidewalls 265 and 266 of the trench 217 are part of the blocks 208 and 209 respectively.

As shown in FIG. 2G, trench 217 has a rectangular shape ("type A trench"). In an embodiment, the bottom portion of the type A trench is substantially perpendicular to the sidewalls. As shown in FIG. 2G, trench 217 has a width 267 and a depth 268. In an embodiment, the width of the trench is from about 20 nm to about 1 µm. In an embodiment, the depth of the trench is from about 50 nm to about 250 nm. In an embodiment, a ratio of the height to weight ("aspect ratio") of the trench is less than 2.

The insulating layer blocks can be removed from substrate 201 using an etching technique known to one of ordinary skill in the art of electronic device manufacturing, such as but not limited to a wet etching, and a dry etching. In an embodiment, insulating layer blocks of silicon nitride are selectively removed to expose the portions of the silicon substrate between the trench sidewall blocks of silicon oxide by a wet etching technique using a hot phosphoric acid at a temperature from about 50° C. to about 200° C.

Figure 2H:
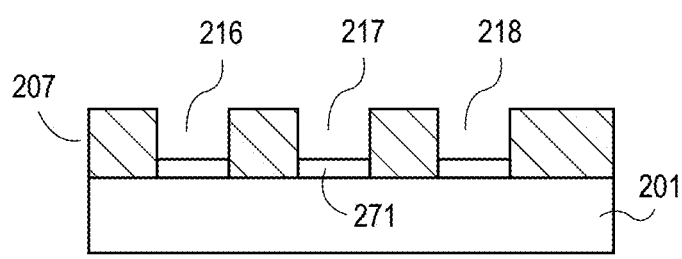
FIG. 2H is a view similar to FIG. 2G, after a nucleation layer is selectively deposited on the exposed portions of the substrate within the trenches according to one embodiment.

FIG. 2H is a view 270 similar to FIG. 2G, after a nucleation layer is selectively deposited on the exposed portions of the substrate within the trenches according to one embodiment. As shown in FIG. 2H, a nucleation layer 271 is selectively deposited on the bottom portions of the trenches that are the exposed portions of the substrate 201. In an embodiment, nucleation layer 271 comprises aluminum nitride, a polycrystalline III-N material, an amorphous III-N material, or any combination thereof. As shown in FIG. 2H, the nucleation layer is not deposited on the sidewalls of the trench. In an embodiment, nucleation layer 271 is selectively deposited on the exposed portions of the silicon substrate within the trench 271 using a metal-organic chemical vapor deposition ("MOCVD") technique. In an embodiment, the nucleation layer 271 is deposited using MOCVD technique at a temperature from about 550° C. to about 800° C. In an embodiment, the nucleation layer 271 is a polycrystalline GaN that is deposited at a temperature less than 600° C. Depositing the nucleation layer 271 at the temperature less than 600° C. provides an advantage of avoiding formation of GaSi complexes.

In an embodiment, the trench sidewalls are portions of the metallic blocks, and the nucleation layer is selectively deposited only on the exposed portions of the silicon substrate at the bottom of the trench without covering the metallic sidewalls of the trench. In an embodiment, the trench sidewall blocks are insulating blocks (e.g., silicon oxide), and the nucleation layer is selectively deposited only on the exposed portions of the silicon substrate at the bottom of the trench without covering the insulating sidewalls of the trench.

In at least some embodiments, the nucleation layer 271 is selectively deposited in the trenches using one of epitaxial techniques, e.g., chemical vapor deposition ("CVD"), metal organic chemical vapor deposition ("MOCVD"), atomic layer deposition ("ALD"), MBE, sputtering, or other selective deposition techniques known to one of ordinary skill in the art of electronic device manufacturing.

In an embodiment, the nucleation layer is deposited within the trenches using a MOCVD technique at a temperature above 900° C. In an embodiment, the nucleation layer of AlN is deposited onto the exposed portions of the substrate within the trenches to the thickness from about 10 nm to about 100 nm.

In an embodiment, the nucleation layer is deposited onto the portions of the silicon substrate within the trenches to prevent the formation of group III elements and silicon (e.g., GaSi, or other group III elements and Si) complexes. In an embodiment, the nucleation layer is deposited onto the portions of the silicon substrate within the trenches to provide a seed hexagonal crystal structure for the III-N material layer formed on the nucleation layer later on in a process. In an embodiment, the nucleation layer is deposited onto the portions of the silicon substrate within the trenches to capture the interface defects that are formed due to the lattice mismatch between III-N material and silicon.

In an embodiment, the type A trench is created by patterning oxide trench sidewall blocks on the Si substrate.

In an embodiment, the Si substrate for the trench type A has a miscut from about 2 degrees to about 10 degrees towards the [110] direction to facilitate III-N nucleation. In an embodiment, the thin nucleation layer is selectively epitaxially deposited on the portions of the substrate having a miscut from about 2 degrees to about 10 degrees towards the [110] direction by using one of a CVD, sputtering, MBE technique, or other deposition technique known to one of ordinary skill in the art of electronic device manufacturing. In an embodiment, the thin nucleation layer is deposited selectively and hence grows only on the exposed Si surface and not on the oxide sidewalls of the trench.

Figure 2I:
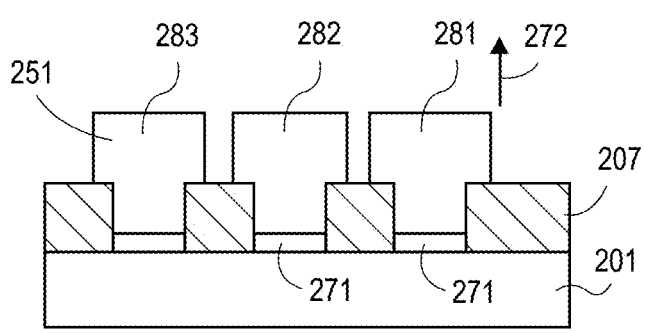
FIG. 2I is a view similar to FIG. 2H, after a III-N material layer is deposited on the nucleation layer according to one embodiment.

FIG. 2I is a view 280 similar to FIG. 2H, after a III-N material layer 251 is deposited on the nucleation layer according to one embodiment. As shown in FIG. 2I, a III-N material layer 251 comprises portions 281, 282, and 283 deposited on the nucleation layer 271 within the trenches. As shown in FIG. 2I, portions 281, 282, and 283 are grown out of the trenches in a vertical direction 272. In an embodiment, the height of the portions 281, 282, and 283 is greater than the depth of the trenches. In an embodiment, the portions of the III-N material layer 251 are grown on the nucleation layer using a selective area epitaxy.

In an embodiment, the III-N material layer is selectively grown on the nucleation layer using one of epitaxial techniques known to one of ordinary skill in the art of electronic device manufacturing, e.g., chemical vapor deposition ("CVD"), metalo organic chemical vapor deposition ("MOCVD"), atomic layer deposition ("ALD"), or other epitaxial growth technique known to one of ordinary skill in the art of electronic device manufacturing. In an embodiment, the III-N material layer is grown vertically on the nucleation layer using a MOCVD technique at a temperature in an approximate range of 900° C.-1100° C. In an embodiment, the III-N material layer is a GaN layer, and the nucleation layer is an AlN layer deposited on the Si substrate.

Figure 2J:
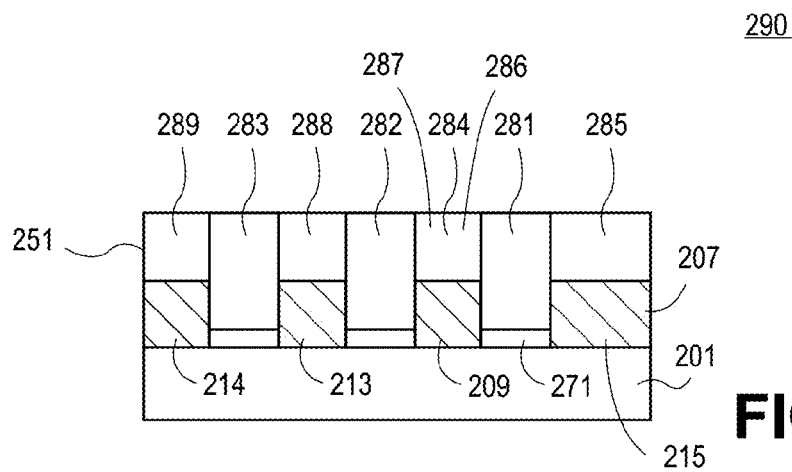
FIG. 2J is a view similar to FIG. 2I, after the III-N material layer is laterally grown over the trenches according to one embodiment.

FIG. 2J is a view 290 similar to FIG. 2I, after the III-N material layer is laterally grown over the trenches according to one embodiment. As shown in FIG. 2J, III-N material layer 251 is laterally grown over the trench sidewall blocks 209, 213, 214, and 215, to form coalesced lateral epitaxial overgrowth ("LEO") islands, such as coalesced LEO islands 284, 285, 288, and 289. As shown in FIG. 2J, coalesced LEO island 284 comprises a portion 286 and a portion 287. Portion 286 is adjacent to portion 287. Portion 286 laterally extends on the sidewall block 209 from vertical portion 281 grown out of trench 218 to merge with portion 287 that laterally extends on the sidewall block 209 from vertical portion 282 grown out of trench 217.

In an embodiment, the III-N material layer is grown vertically out of the trenches and laterally to form a coalesced island. In an embodiment, the III-N material layer is a GaN layer. Due to the material properties of the Wurtzite crystal system of the GaN, the dislocation defects usually propagate parallel to the vertical growth direction, (e.g., along a (0001) crystal axis direction), and hence the laterally merged portions of GaN over the oxide sidewalls can have much reduced defect density comparing with the vertically grown areas of GaN. Because the GaN islands are on top of an oxide layer and only in certain small areas of the entire Si wafer, the total thermal stress developed in GaN due to the thermal expansion mismatch is not significant that leads to the reduction of surface cracks on GaN as compared to GaN layers grown on blanket Si wafers.

In an embodiment, the III-N material layer grown over the trenches expands in the lateral direction over the trench sidewall blocks by modifying the epitaxial growth parameters, for example, temperature, pressure, or both. In an embodiment, a ratio of the LEO rate to the vertical growth rate of the III-N material layer is at least 5. In an embodiment, expanding the III-N material layer in the lateral direction on the trench sidewall blocks involves increasing the temperature above 1100° C. In an embodiment, expanding the III-N material layer in the lateral direction on the trench sidewall blocks involves decreasing the pressure in the growth chamber down to below 200 Torr, and more specifically, down to about 50 Torr. In an embodiment, expanding the III-N material layer in the lateral direction on the trench sidewall blocks involves adding chemical elements (e.g., magnesium ("Mg"), antimony ("Sb"), indium ("In"), or other chemical elements) into the grown chamber to reduce the vertical growth rate relative to the lateral growth rate. These chemical elements act like surfactants that attach to the portions of the III-N material layer growth within the trenches and end up in reducing the vertical growth rate of the III-N material layer. In an embodiment, the gas phase concentration of Mg in the growth chamber during GaN growth is from about 1% to about 5% of total Ga gas phase concentration. In an embodiment, the gas phase concentration of Sb in the growth chamber during GaN growth is from about 0.5% to about 5% of total Ga gas phase concentration. In an embodiment, the gas phase concentration of In in the growth chamber during GaN growth is from about 0.1% to about 5% of total Ga gas phase concentration. In an embodiment, III-N material layer is GaN, InGaN, any other III-N material, any other III-N material, or any combination thereof. In an embodiment, the thickness of the III-N material layer from the bottom of the trench to the merged island top is about 50 nm to about 2 μm.

In the nitride material system, threading dislocations typically propagate along a vertical direction, and hence by using lateral growth a substantially defect free or low defect density GaN film is created. In an embodiment, the substantially defect free LEO GaN (or other III-N material) layer is deposited on top of the oxide trench sidewall blocks to provide a GaN (or other III-N material)-on-insulator structure for GaN transistors. For example, GaN is wideband gap material (3.4 eV) and combined with the underlying insulator can lead to extremely low body leakage currents (order of femto to pico amps/mm) for the transistors, which makes it suitable for RF applications and power transistors used in power management ICs. In an embodiment, the substantially defect free LEO GaN (or other III-N material) is deposited on top of the metallic trench sidewall blocks to provide a GaN (or other III-N material) on a metal structure for GaN (or other III-N material) based capacitors, e.g., metal-insulator-metal ("MIM") structures. Forming LEO III-N material layer on top of the trench sidewall blocks advantageously mitigates surface cracks and defect density while eliminating the need for very complicated and thick buffer layers. Depending on the trench width, the growth times for III-N layers can also be reduced by at least 10× resulting in significant improvements for high volume production.

Figure 2K:
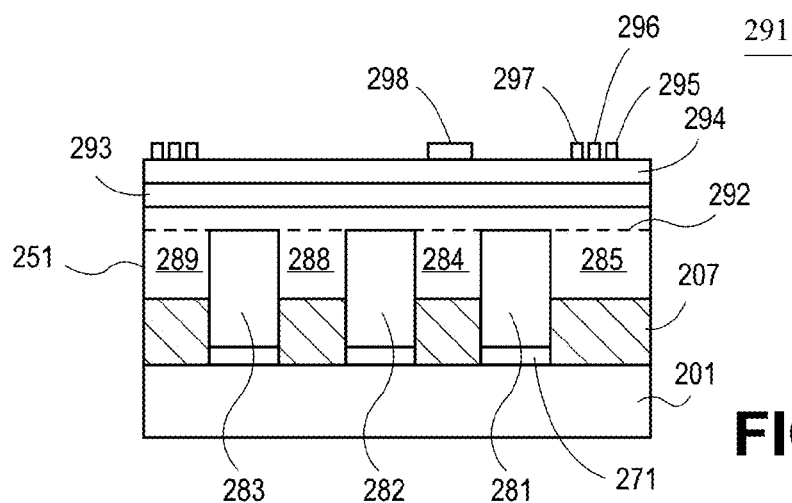
FIG. 2K is a view, after a device layer is deposited over the laterally grown III-N material layer according to one embodiment.

FIG. 2K is a view 291, after a device layer is deposited over the laterally grown III-N material layer according to one embodiment. As shown in FIG. 2K, a capping layer 293 is deposited on the laterally grown III-N material layer 251. In an embodiment, capping layer 293 is deposited to enhance mobility in a two-dimensional electron gas ("2DEG") portion 292 of the III-N material layer 251. In an embodiment, the capping layer 293 is AlN, AlInN, AlGaN, or any combination thereof. In an embodiment, the thickness of the capping layer 293 is from about 1 nm to about 2 nm.

In an embodiment, the capping layer, due to the polarization difference between the III-N material layer and itself, leads to the formation of a high charge density and high mobility 2DEG (2-dimensional electron gas) in the III-N material layer. In an embodiment, the capping layer is deposited on the laterally grown III-N material layer using one of epitaxial growth techniques, e.g., chemical vapor deposition ("CVD"), metal organic chemical vapor deposition ("MOCVD"), atomic layer deposition ("ALD"), MBE, or other epitaxial growth technique known to one of ordinary skill in the art of electronic device manufacturing.

As shown in FIG. 2K, a device layer 294 is deposited on capping layer 293. In an embodiment, device layer 294 includes a III-N material, e.g., AlGaN, AlInN, AlN, any other III-N material, or any combination thereof. In an embodiment, device layer 294 is an AlxGa1-x N layer, where x is from about 15% to about 40%. In an embodiment, device layer 294 is an AlxIn1-x N layer, where x is greater than about 80%. In an embodiment, device layer 294 is an AlN layer. The thickness of the device layer 294 determined by a device design. In an embodiment, the thickness of the device layer 294 is from about 2 nm to about 30 nm.

In an embodiment, device layer 294 is deposited on the capping layer using one of epitaxial growth techniques, e.g., chemical vapor deposition ("CVD"), metal organic chemical vapor deposition ("MOCVD"), atomic layer deposition ("ALD"), MBE, or other epitaxial growth technique known to one of ordinary skill in the art of electronic device manufacturing. As shown in FIG. 2K, device contacts, such as device contacts 295, 296, 297, and 298 are formed over the portions of device layer 294 over the LEO portions of the III-N material layer 251 to form one or more III-N material based devices according to one embodiment. The III-N material based devices can be, for example, high voltage transistors (e.g., GaAs, GaN transistors), capacitors, voltage regulators, RF-power amplifiers, power management integrated circuits, or other III-N material based electronic devices.

In an embodiment, the trench sidewall blocks 209, 213, 214, and 215 are insulating blocks. In an embodiment, contact 296 is a gate electrode deposited over a gate dielectric (not shown) on the device layer 294 over the LEO portion 285 of III-N material layer 251. Contact 295 is a source contact on a source region (not shown), and contact 297 is a drain contact on a drain region (not shown) of the device layer 294 over the LEO portion 285 of III-N material layer 251. In an embodiment, the trench sidewall blocks 209, 213, 214, and 215 are metallic blocks. In an embodiment, at least one of contacts 295, 296, 297, and 298 acts as a top capacitor contact on the device layer 294 over the LEO portion of the III-N material layer 251, and at least one of the trench sidewall blocks 209, 213, 214, and 215 acts as a bottom capacitor contact.

The contacts, gate dielectric, drain and source regions can be formed on the III-N material device layer using techniques known to one of ordinary skill in the art of electronic device manufacturing.

Figure 2L:
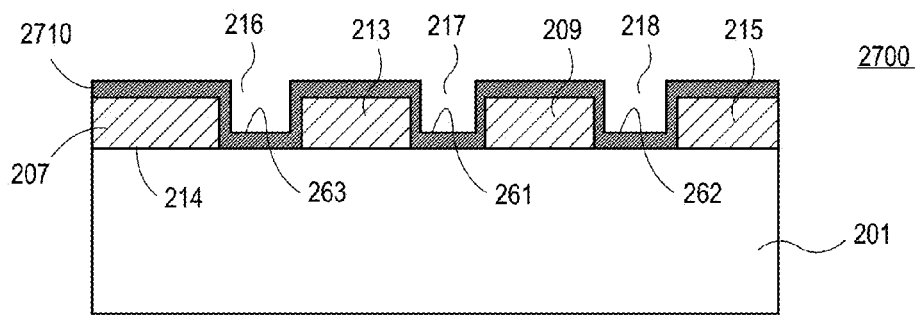
FIG. 2L is a view similar to FIG. 2G, after a nucleation layer is deposited on the exposed portions of the substrate within the trenches according to another embodiment.

FIG. 2L is a view 2700 similar to FIG. 2G, after a nucleation layer 2710 is deposited on the exposed portions of the substrate within the trenches according to another embodiment. FIG. 2L is different from FIG. 2H in that the deposition of the nucleation layer 2710 is not selective. As shown in FIG. 2L, the nucleation layer 2710 is deposited over the trench layer 207 covering the exposed portions 261, 262, and 263 of the substrate 201 and the trench sidewall blocks 209, 213, 214, and 215. In an embodiment, nucleation layer 2710 comprises aluminum nitride, a polycrystalline III-N material, an amorphous III-N material, or any combination thereof. In an embodiment, the nucleation layer 2710 is an amorphous nucleation layer deposited on the oxide sidewalls of the trench. In an embodiment, the trench sidewall blocks are insulating blocks (e.g., silicon oxide), and the nucleation layer is deposited on the exposed portions of the silicon substrate at the bottom of the trench and on the insulating sidewalls of the trench. The nucleation layer 2710 can be deposited in the trenches using one of epitaxial techniques, e.g., chemical vapor deposition ("CVD"), metal organic chemical vapor deposition ("MOCVD"), atomic layer deposition ("ALD"), MBE, sputtering, or other deposition techniques known to one of ordinary skill in the art of electronic device manufacturing.

In an embodiment, the nucleation layer is deposited within the trenches using a MOCVD technique at a temperature above 9000° C. In an embodiment, the nucleation layer of AlN is deposited onto the exposed portions of the substrate and the sidewalls of the trenches to the thickness from about 10 nm to about 100 nm.

Figure 2M:
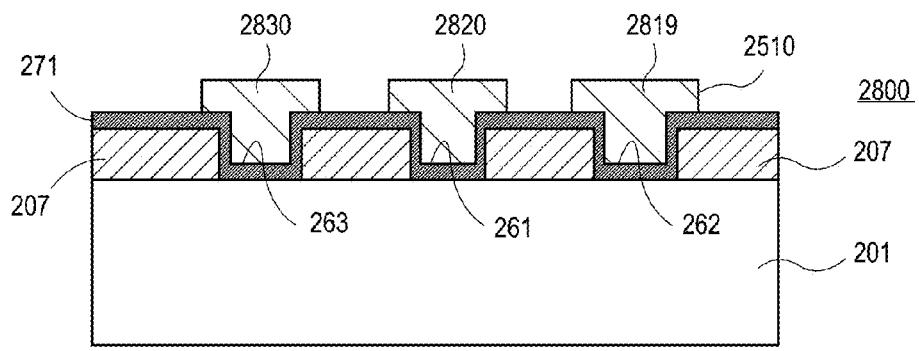
FIG. 2M is a view similar to FIG. 2L, after a III-N material layer is deposited on the nucleation layer according to one embodiment.

FIG. 2M is a view 2800 similar to FIG. 2L, after a III-N material layer 251 is deposited on the nucleation layer according to one embodiment. As shown in FIG. 2M, a III-N material layer 2510 comprises portions 2810, 2820, and 2830 deposited on the nucleation layer 2710 within the trenches. As shown in FIG. 2M, portions 2810, 2820, and 2830 are grown out of the trenches in a vertical direction, as described above. In an embodiment, the height of the portions 2810, 2820, and 2830 is greater than the depth of the trenches. In an embodiment, the portions of the III-N material layer 251 are grown on the nucleation layer using a selective area epitaxy. The III-N material layer can be selectively grown on the nucleation layer using one of epitaxial techniques known to one of ordinary skill in the art of electronic device manufacturing, e.g., chemical vapor deposition ("CVD"), metal organic chemical vapor deposition ("MOCVD"), atomic layer deposition ("ALD"), or other epitaxial growth technique known to one of ordinary skill in the art of electronic device manufacturing. In an embodiment, the III-N material layer is grown on the nucleation layer using a MOCVD technique at a temperature in an approximate range of 900° C. 1100° C. In an embodiment, the III-N material layer is a GaN layer, and the nucleation layer is an AlN layer deposited on the Si substrate and on the sidewalls of the trench.

Figure 2N:
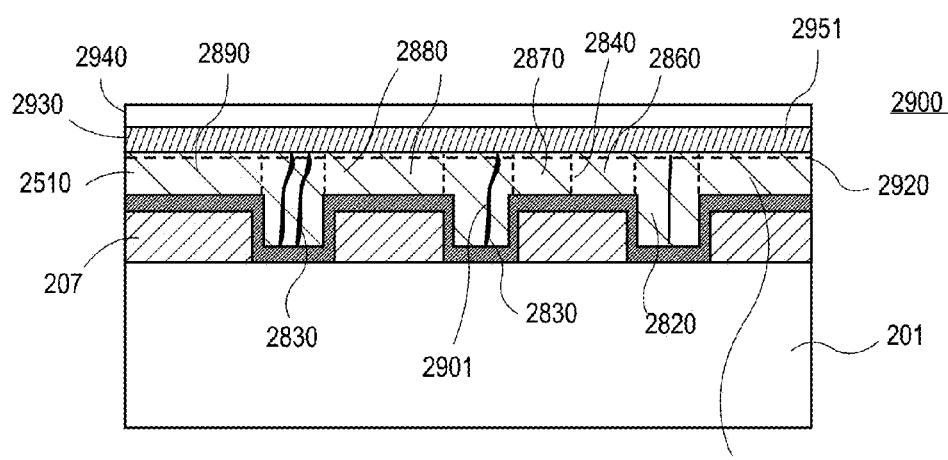
FIG. 2N is a view 2900 similar to FIG. 2M, after a device layer is deposited over a III-N material layer laterally grown over the trenches according to one embodiment.

FIG. 2N is a view 2900 similar to FIG. 2M, after a device layer is deposited over a III-N material layer laterally grown over the trenches according to one embodiment. As shown in FIG. 2N, III-N material layer 2510 is laterally grown on the nucleation layer 2710 over the trench sidewall blocks to form lateral epitaxial overgrowth ("LEO") coalesced islands, such as LEO islands 2840, 2850, 2880, and 2890. As shown in FIG. 2J, LEO island 2840 comprises a portion 2860 adjacent to a portion 2870. Portion 2860 is laterally grown on the nucleation layer on the sidewall block 209 from vertical portion 2810 grown out of trench 218 and portion 2870 is laterally grown on the nucleation layer on the sidewall block 209 from vertical portion 2820 grown out of trench 217.

In an embodiment, the III-N material layer is grown vertically out of the trenches and then subsequently laterally on the nucleation layer to form a coalesced island. In an embodiment, the III-N material layer is a GaN layer. As shown in FIG. 2N, the dislocation defects, such as a dislocation defect 2901 propagate substantially parallel to a vertical growth direction, (e.g., along a (0001) crystal axis). The laterally merged portions of III-N material layer have substantially reduced defect density comparing with the vertically grown areas of the III-N material. Because the III-N material islands are only in certain small areas of the entire Si wafer, the total thermal stress developed in the III-N material due to the thermal expansion mismatch is substantially reduced leading to the reduction of surface cracks on the III-N material.

In an embodiment, the III-N material layer grown over the trenches grows in the lateral direction on the nucleation layer over the trench sidewall blocks by modifying the epitaxial growth parameters, for example, temperature, pressure, or both, as described above. In an embodiment, the thickness of the III-N material layer is from about 50 nm to about 2 µm.

As shown in FIG. 2N, a capping layer 2930 is deposited on the laterally grown III-N material layer 2510. In an embodiment, capping layer 2930 is deposited to enhance mobility in a two-dimensional electron gas ("2DEG") portion 2920 of the III-N material layer 2510, as described above. In an embodiment, the capping layer 2930 is AlN, AlInN, AlGaN, or any combination thereof. In an embodiment, capping layer 2930 represents one of the capping layers described above.

As shown in FIG. 2N, a device layer 2940 is deposited on capping layer 2930. In an embodiment, device layer 2940 includes a III-N material, e.g., AlGaN, AlInN, AlN, any other III-N material, or any combination thereof. In an embodiment, device layer 2940 represents one of the device layers described above. Contacts can be formed over the portions of device layer 2940 over the LEO portions of the III-N material layer 2510 to form one or more III-N material based devices, as described above.

Figure 3A:
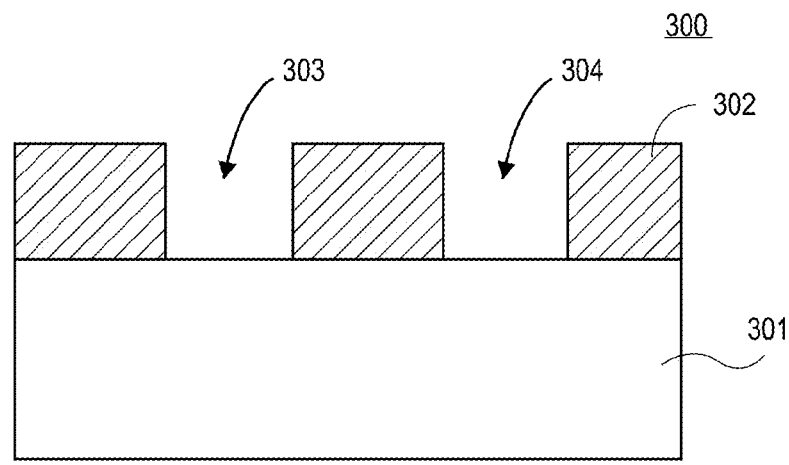
FIG. 3A is a side view of an electronic device structure according to one embodiment.

FIG. 3A is a side view 300 of an electronic device structure according to one embodiment. As shown in FIG. 3A, trenches such as a trench 303 and a trench 304 are formed in a trench layer 302 on a substrate 301. As shown in FIG. 3A, each of the trenches 303 and 304 has a bottom portion and opposing sidewalls. The bottom portion of each trench is a portion of the substrate 301, as described above. In an embodiment, the electronic device structure depicted in FIG. 3A represents the structure depicted in FIG. 2G.

Figure 3B:
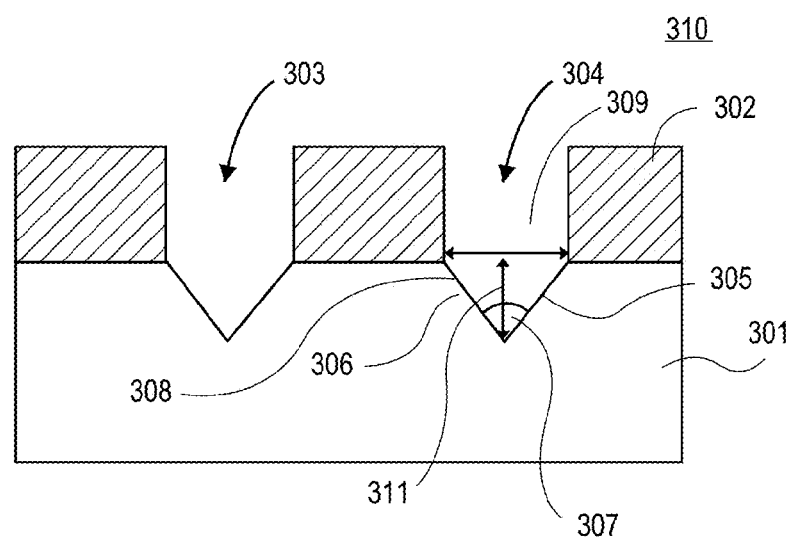
FIG. 3B is a view similar to FIG. 3A after the portions of the substrate within the trenches are etched according to one embodiment.

FIG. 3B is a view 310 similar to FIG. 3A after the portions of the substrate within the trenches are etched according to one embodiment. As shown in FIG. 3B, the portions of the substrate 301 exposed within the trenches 303 and 304 are etched using trench sidewall blocks as a mask to form V-grooves, such as a V-groove 308.

In an embodiment, the portions of the substrate are wet etched using for example, tetramethylammonium hydroxide ("TMAH"), potassium hydroxide ("KOH"), ammonium hydroxide ("NH4OH", or any combination thereof based wet etchants at room temperature or at a temperature greater than the room temperature. This wet etch process etches the portions of the substrate aligned along a (100) crystallographic plane (Si (100)) fast and slows down at the portions of the substrate aligned along (111) crystallographic planes (Si (111)). This etch process stops when the portions of Si (111) are met that results in a V-shaped trench ("type B trench"). As shown in FIG. 3B, the bottom portion of the V-shaped trench 304 has V-groove 308 etched in the substrate 301. V-groove 308 comprises arms 305 and 306 aligned along (111) crystal planes. Arm 305 meets arm 306 at an angle 307. In an embodiment, given the geometry of Si (111) planes, a depth 311 of the V-groove is approximately 7/10th of the initial width of the trench. In an embodiment, the initial width of the trench is a distance 309 between trench sidewall blocks. In an embodiment, distance 309 in an approximate range from about 50 nm to about 1 µm. In an embodiment, the depth 311 is in an approximate range from about 35 nm to about 700 nm. In an embodiment, a dry etch using gases SF6, XeF2, BCl3, Cl2, or any combination thereof is used to etch the portions silicon substrate 301 to form the V-grooves. In one embodiment, the V-grooves are formed by etching the portions of substrate 301 using a wet etching, dry etching, or a both wet etching and dry etching techniques known to one of ordinary skill in the art of electronic device manufacturing.

Figure 3C:
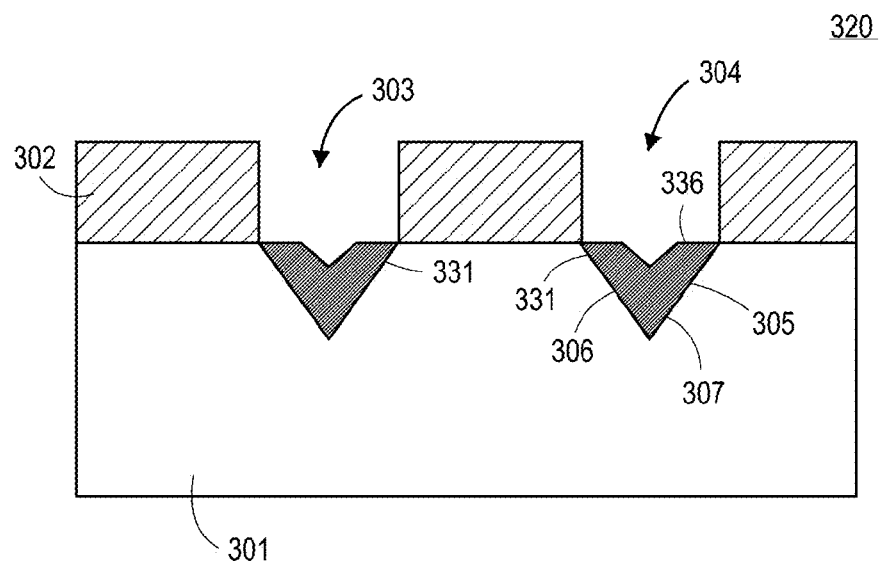
FIG. 3C is a view similar to FIG. 3B, after a nucleation layer is deposited on the portions of the substrate within the v-shaped trenches according to one embodiment.

FIG. 3C is a view 320 similar to FIG. 3B, after a nucleation layer is deposited on the portions of the substrate within the V-shaped trenches according to one embodiment. As shown in FIG. 3C, a nucleation layer 331 is selectively deposited within the V-grooves of the substrate 301 to a predetermined thickness. In an embodiment, the nucleation layer 331 deposited on arms 305 and 306 is thick enough to substantially fill the V-groove to provide a substantially flat growth front 336 to ensure that the III-N material layer grows on the nucleation layer with a proper polarity and orientation (e.g., for GaN layer along a c-crystal axis (0001)) along a vertical axis. If the growth front of the nucleation layer deposited on V-grooves is not flat, the portions of the III-N material layer grown over the two arms 305 and 306 of the V groove may collide into each other and create new defects like stacking faults, cubic phases, or other imperfections at a merging boundary region, as described in further detail with respect to FIG. 3F.

In an embodiment, the thickness of the nucleation layer 331 deposited on the V-grooves of the substrate 301 is at least a half of the distance 309. In an embodiment, the thickness of the nucleation layer is at least 25 nm.

In an embodiment, the nucleation layer 331 is deposited to the thickness that corresponds to the depth 311 of the V-groove. In an embodiment, the thickness of the nucleation layer deposited into the V-groove ranges from about 25 nm to about 700 nm.

In an embodiment, due to the lower lattice mismatch between III-N materials and Si (111) (e.g., the lattice mismatch between GaN and Si (111) is about 17%, whereas the lattice mismatch between GaN and Si (100) is about 41%) and the hexagonal lattice planes of Si (111), the nucleation of III-N on Si (111) provides much greater crystal quality than that on Si (100). In an embodiment, nucleation layer 331 comprises aluminum nitride, a polycrystalline III-N material, an amorphous III-N material, or any combination thereof. As shown in FIG. 3C, the nucleation layer is not deposited on the sidewalls of the trench. In an embodiment, nucleation layer 331 is selectively deposited within the V-grooves of the substrate 301 using a molecular beam epitaxy ("MBE") technique, as described above with respect to FIG. 2H.

In an embodiment, the trench sidewalls are portions of the metallic blocks, and the nucleation layer is selectively deposited on the V-grooves of the silicon substrate without covering the metallic sidewalls of the trench. In an embodiment, the trench sidewall blocks are insulating blocks (e.g., silicon oxide), and the nucleation layer is selectively deposited only on the V-grooves of the silicon substrate without covering the insulating sidewalls of the trench. In an embodiment, the substrate 301 for the V-shaped trench type B is a Si (100) blanket wafer.

In at least some embodiments, the nucleation layer is selectively deposited on the V-grooves of the silicon substrate using one of epitaxial techniques, e.g., CVD, MBE, metal organic chemical vapor deposition ("MOCVD"), atomic layer deposition ("ALD"), sputtering, or other selective deposition techniques known to one of ordinary skill in the art of electronic device manufacturing, as described above with respect to FIG. 1H1.

Figure 3D:
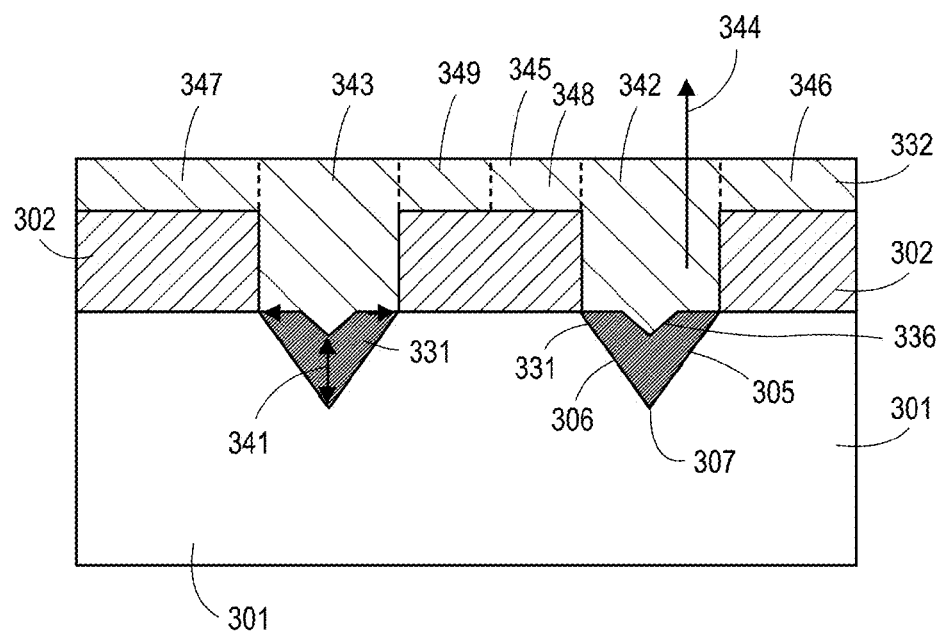
FIG. 3D is a view similar to FIG. 3C, after a III-N material layer is deposited on the nucleation layer according to one embodiment.

FIG. 3D is a view 330 similar to FIG. 3C, after a III-N material layer is deposited on the nucleation layer according to one embodiment. As shown in FIG. 3D, a III-N material layer 332 comprises portions 342, and 343 deposited on the nucleation layer 331 on the V-grooves within the trenches. As shown in FIG. 3C, portions 342, and 343 are grown out of the trenches in a vertical direction 342 (e.g., a c-crystal axis (0001)). In an embodiment, the portions of the III-N material layer 332 are vertically grown on the nucleation layer using a selective area epitaxy, as described above. In an embodiment, GaN is grown on top of the nucleation layer. Once the III-N material layer is grown out of the V-shaped trench, the III-N material layer is laterally overgrown by changing growth parameters (e.g., temperature, pressure, surfactants, or any combination thereof) to form coalesced island, as described above with respect to type A trench.

In an embodiment, III-N material layer 332 represents one of the III-N material layers described herein. As shown in FIG. 3D, III-N material layer 332 is laterally grown over the trench sidewall blocks to form coalesced lateral epitaxial overgrowth ("LEO") islands, such as coalesced LEO islands 345, 346, and 347, as described above. As shown in FIG. 3D, coalesced LEO island 345 comprises a portion 348 adjacent to a portion 349. Portion 248 laterally extends on the sidewall block from vertical portion 342 to merge with portion 349 that laterally extends on the sidewall block from vertical portion 343, as described above.

Figure 3E:
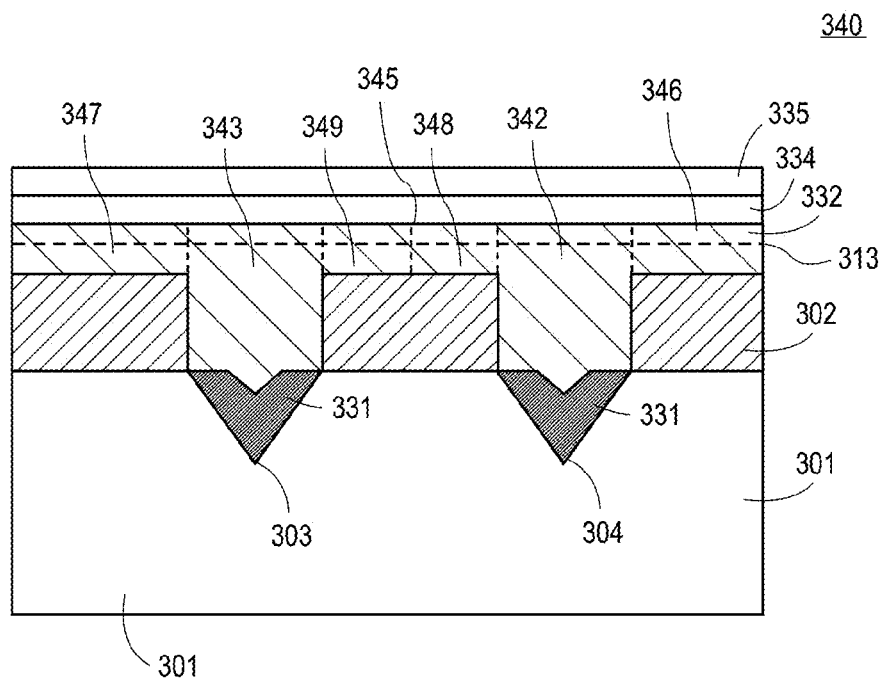
FIG. 3E is a view similar to FIG. 3D after a device layer is deposited over the laterally grown III-N material layer according to one embodiment.

FIG. 3E is a view 340 similar to FIG. 3D after a device layer is deposited over the laterally grown III-N material layer according to one embodiment. As shown in FIG. 3E, a capping layer 334 is deposited on the laterally grown III-N material layer 332. In an embodiment, capping layer 334 is deposited to enhance mobility in a two-dimensional electron gas ("2DEG") portion 333 of the III-N material layer 332. In an embodiment, the capping layer 333 represents one of the capping layers described above. As shown in FIG. 3E, a device layer 335 is deposited on capping layer 334. In an embodiment, the device layer 335 represents one of the device layers described above. In an embodiment, device contacts are formed over the portions of device layer 335 over the LEO portions of the III-N material layer 332 to form one or more III-N material based devices, as described above.

Figure 3F:
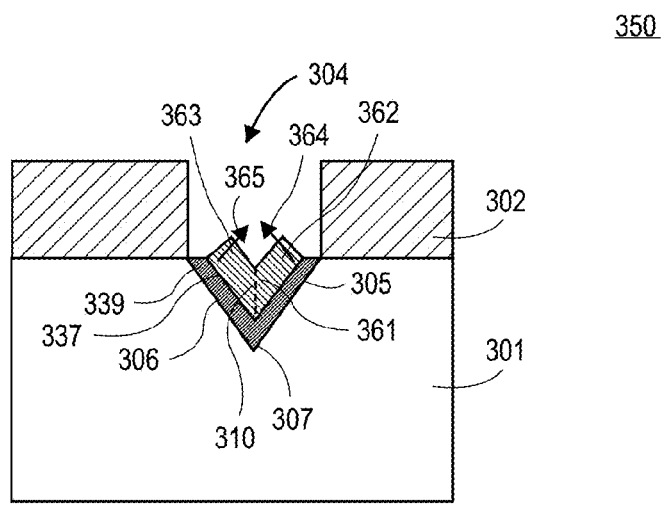
FIG. 3F is a portion of the view similar to FIG. 3B, after a nucleation layer is deposited on the portions of the substrate within the V-shaped trenches according to another embodiment.

FIG. 3F is a portion of the view similar to FIG. 3B, after a nucleation layer is deposited on the portions of the substrate within the V-shaped trenches according to another embodiment. FIG. 3F illustrates the case when the thickness of the nucleation layer deposited on the V-groove is not thick enough to provide a flat growth front. As shown in FIG. 3F, a nucleation layer 339 is deposited on arms 305 and 306 of the V-groove. Nucleation layer 339 has a growth front 337 that is not flat. A III-N material layer 361 that grows on growth front 337 comprises portions 362 and 363. As shown in FIG. 3F, portion 362 grows in a direction 364 substantially perpendicular to arm 305, and portion 363 grows in a direction 365 substantially perpendicular to arm 306. As such, the portions of the III-N material layer 339 growing on front 337 may collide into each other and create new defects e.g., stacking faults, cubic phases, or other imperfections at a merging boundary region 3610. In an embodiment, growth conditions (e.g., temperature, pressure, surfactants, or any combination thereof) are adjusted to keep the merging boundary region 3610 as narrow as possible.

Figure 3G:
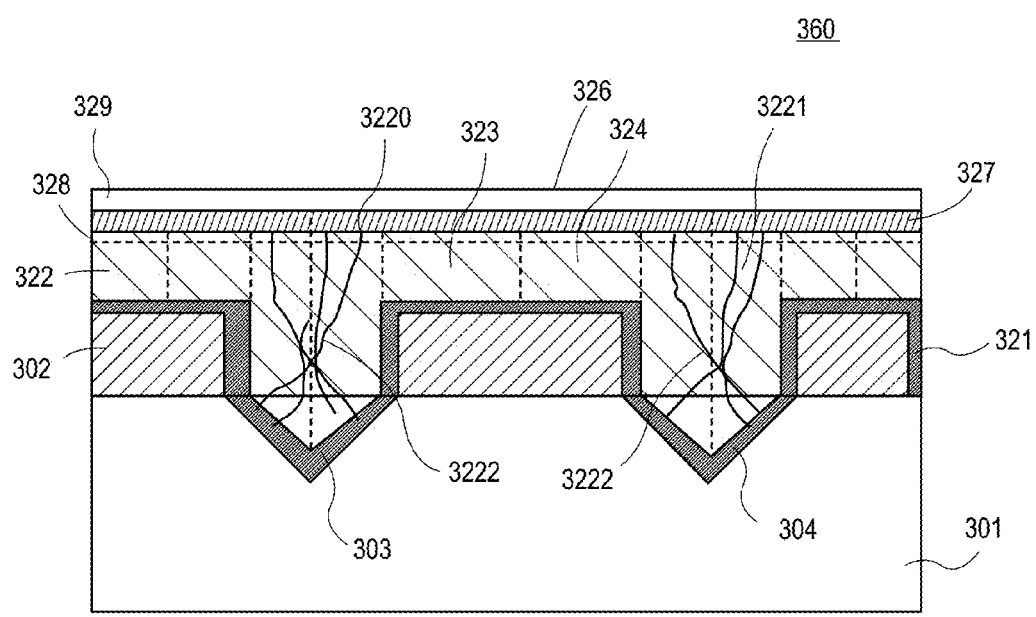
FIG. 3G is a view similar to FIG. 3B, after a device layer is deposited on a capping layer over a laterally grown III-N material layer on a nucleation layer on the V-grooves of the substrate according to another embodiment.

FIG. 3G is a view 360 similar to FIG. 3B, after a device layer 329 is deposited on a capping layer 328 over a laterally grown III-N material layer 322 on a nucleation layer 321 on the V-grooves of the substrate according to another embodiment. As shown in FIG. 3G, a III-N material layer 332 comprises portions 3220 and 3221 deposited on the nucleation layer 321 on the V-grooves within the trenches. As shown in FIG. 3G, portions 3220 and 3221 are grown out of the V-shaped trenches in a vertical direction (e.g., a c-crystal axis (0001)). In an embodiment, the portions 3220 and 3221 of the III-N material layer 322 are vertically grown on the nucleation layer using a selective area epitaxy, as described above. In an embodiment, the III-N material layer 322 is a GaN layer.

In an embodiment, III-N material layer 322 represents one of the III-N material layers described herein. As shown in FIG. 3G, III-N material layer 322 is laterally grown over the trench sidewall blocks to form coalesced lateral epitaxial overgrowth ("LEO") islands, such as a coalesced LEO island 326. As shown in FIG. 3G, coalesced LEO island 326 comprises a LEO portion 323 adjacent to a LEO portion 324. Portion 323 laterally extends on the sidewall block from vertical portion 3220 to merge with portion 324 that laterally extends on the sidewall block from vertical portion 3221, as described above.

As shown in FIG. 3G, capping layer 327 is deposited on the laterally grown III-N material layer 322. In an embodiment, capping layer 327 is deposited to enhance mobility in a two-dimensional electron gas ("2DEG") portion 328 of the III-N material layer 322. In an embodiment, the capping layer 327 represents one of the capping layers described above. As shown in FIG. 3G, device layer 329 is deposited on capping layer 327. In an embodiment, the device layer 329 represents one of the device layers described above. In an embodiment, device contacts are formed over the portions of device layer 329 over the LEO portions of the III-N material layer 322 to form one or more III-N material based devices, as described above.

FIG. 3G is different from FIG. 3E in that the deposition of the nucleation layer 321 is not selective. As shown in FIG. 3G, the nucleation layer 321 covers the V-grooves and the trench sidewall blocks. In an embodiment, the trench sidewall blocks are insulating blocks (e.g., silicon oxide), and the nucleation layer 321 is deposited on the V-grooves of the silicon substrate at the bottom of the trench and on the insulating sidewalls of the trench. As shown in FIG. 3G, dislocation defects 3222 propagate substantially parallel to a vertical growth direction, (e.g., along a (0001) crystal axis). The laterally merged portions of III-N material layer have substantially reduced defect density comparing with the vertically grown areas of the III-N material, as described above. In this embodiment too the thickness of the nucleation layer 321 at the bottom of the V-groove can be tuned such that it presents a flat growth front for the growth of layer 322.

Figure 4A:
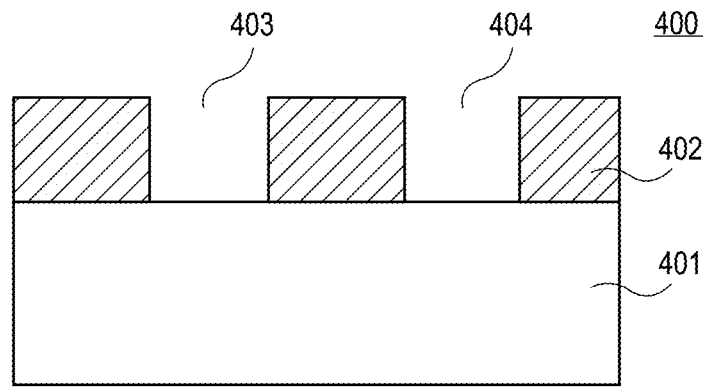
FIG. 4A is a side view of an electronic device structure according to one embodiment.

FIG. 4A is a side view 400 of an electronic device structure according to one embodiment. As shown in FIG. 4A, trenches such as a trench 403 and a trench 404 are formed in a trench layer 402 on a substrate 401. As shown in FIG. 4A, each of the trenches 403 and 404 has a bottom portion and opposing sidewalls. The bottom portion of each trench is a portion of the substrate 401, as described above. In an embodiment, the electronic device structure depicted in FIG. 4A represents the structure depicted in FIG. 2G.

Figure 4B:
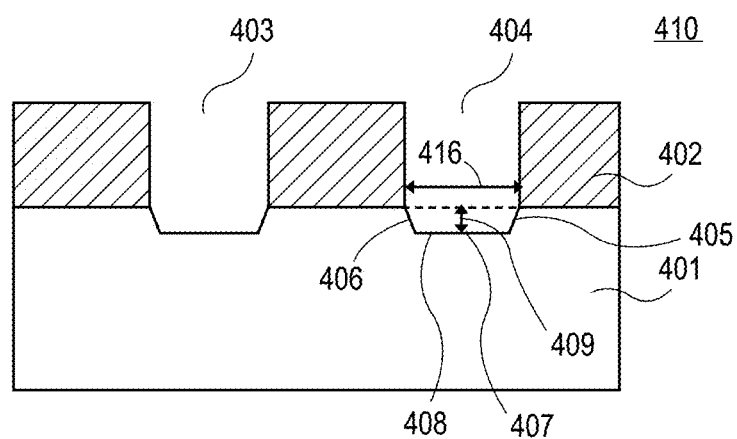
FIG. 4B is a view similar to FIG. 4A after the portions of the substrate within the trenches are etched according to one embodiment.

FIG. 4B is a view 410 similar to FIG. 4A after the portions of the substrate within the trenches are etched according to one embodiment. As shown in FIG. 4B, the bottom portion of the trench 404 comprises a trapezoidal trench 408 ("type C trench") formed in substrate 401. The trapezoidal trench comprises arms 405 and 406, and a bottom 407. Arms 405 and 406 are etched portions of the substrate 401 aligned along (111) crystal planes. Bottom 407 is an etched portion of the substrate 401 aligned along a (100) crystal plane. In an embodiment, a depth 409 of the trapezoidal trench is from about 30 nm to about 2 µm. In an embodiment, the initial width of the trench which is a distance 411 between the trench sidewall blocks is from about 100 nm to about 10 µm. In an embodiment, the portions of the substrate 401 within trenches are etched for a predetermined time using trench sidewall blocks as a mask to form the trapezoidal trench.

In one embodiment, the portions of substrate 401 are wet etched using for example, TMAH, KOH, NH4OH, or any combination thereof based wet etchants at room temperature or at a temperature greater than the room temperature. The time controlled wet etch process etches the portions of the substrate aligned along (100) crystallographic plane (Si (100)) and the portions of the substrate aligned along (111) planes (Si (111)). Unlike the type B trench, the wet etch is stopped before portions of the substrate aligned along (111) are met to form a trapezoidal trench ("type C trench"). In an embodiment, the type C trench is created by wet etching for a predetermined time for example, about 10 s 500 s using TMAH and KOH wet etch solutions of Si fins. If the wet etch is allowed to proceed for a time longer than the predetermined time, the wet etch can result in the formation of type B trench.

In an embodiment, a dry etch using gases SF6, XeF2, BCl3, Cl2, or any combination thereof is used to etch the portions silicon substrate 401 to form the trapezoidal shaped trench. In one embodiment, the trapezoidal trenches are formed by etching the portions of substrate 401 using a wet etching, dry etching, or a both wet etching and dry etching techniques known to one of ordinary skill in the art of electronic device manufacturing.

Figure 4C:
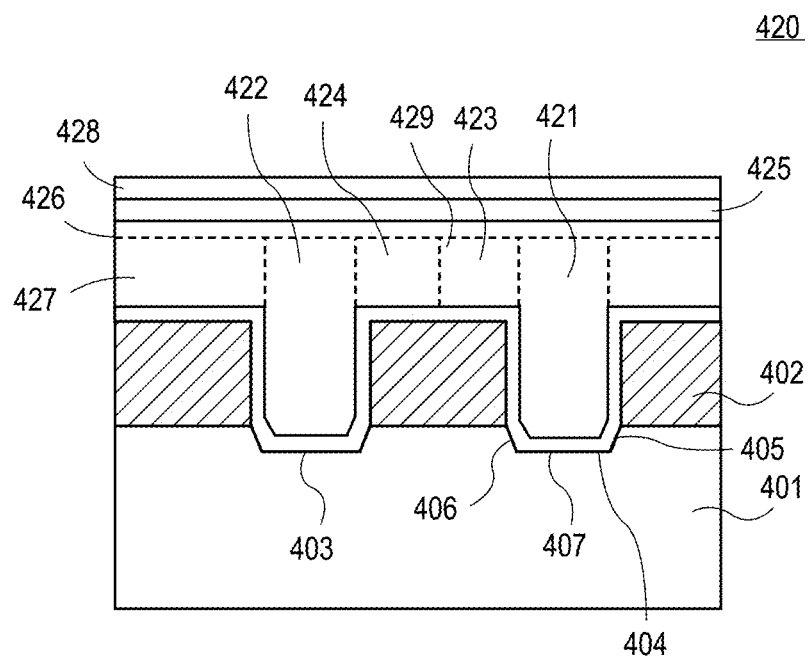
FIG. 4C is a view similar to FIG. 4B, after a device layer is deposited on a capping layer over a laterally grown III-N material layer on a nucleation layer on the trapezoidal trenches of the substrate according to another embodiment.

FIG. 4C is a view similar to FIG. 4B, after a device layer 428 is deposited on a capping layer 425 over a laterally grown III-N material layer 427 on a nucleation layer 411 on the trapezoidal trenches of the substrate according to another embodiment. As shown in FIG. 4C, nucleation layer 411 covers the arms 405 and 406 and the bottom 407 of the trapezoidal shaped trenches 403 and 404 and the trench sidewall blocks. In an embodiment, the trench sidewall blocks are insulating blocks (e.g., silicon oxide), and the nucleation layer 411 is deposited on the arms and the bottom of the trapezoidal shaped trenches of the silicon substrate and on the insulating sidewalls of the trench.

As shown in FIG. 4C, a III-N material layer 427 comprises portions 421 and 422 deposited on the nucleation layer 411 within the trapezoidal trenches. As shown in FIG. 4C, portions 421 and 422 are grown out of the trapezoidal-shaped trenches in a vertical direction (e.g., a c-crystal axis (0001)). In an embodiment, the portions 421 and 422 of the III-N material layer 427 are vertically grown on the nucleation layer using a selective area epitaxy, as described above. In an embodiment, III-N material layer 427 represents one of the III-N material layers described herein. In an embodiment, the III-N material layer 427 is a GaN layer.

As shown in FIG. 4C, III-N material layer 427 is laterally grown over the trench sidewall blocks to form coalesced lateral epitaxial overgrowth ("LEO") islands, such as a coalesced LEO island 429. As shown in FIG. 4C, coalesced LEO island 429 comprises a LEO portion 423 adjacent to a LEO portion 424. Portion 423 laterally extends on the sidewall block from vertical portion 421 to merge with portion 424 that laterally extends on the sidewall block from vertical portion 422, as described above.

As shown in FIG. 4C, capping layer 425 is deposited on the laterally grown III-N material layer 427. In an embodiment, capping layer 425 is deposited to enhance mobility in a two-dimensional electron gas ("2DEG") portion 426 of the III-N material layer 427. In an embodiment, the capping layer 425 represents one of the capping layers described above. In an embodiment, the device layer 428 represents one of the device layers described above. In an embodiment, device contacts are formed over the portions of device layer 428 over the LEO portions of the III-N material layer 427 to form one or more III-N material based devices, as described above.

Figure 4D:
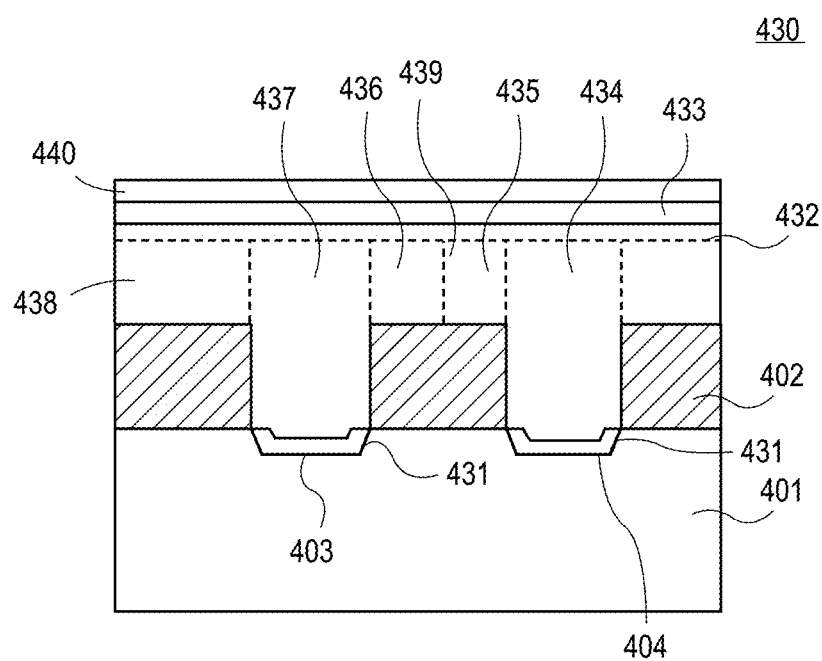
FIG. 4D is a view similar to FIG. 4B, after a device layer is deposited on a capping layer over a III-N material layer over a nucleation layer on the trapezoidal trenches of the substrate according to another embodiment.

FIG. 4D is a view similar to FIG. 4B, after a device layer 440 is deposited on a capping layer 433 over a III-N material layer 438 over a nucleation layer 431 on the trapezoidal trenches of the substrate according to another embodiment. FIG. 4D is different from FIG. 4C in that the nucleation layer 431 is selectively deposited only on the arms and the bottom of the trapezoidal shaped trenches 403 and 404, and does not cover the trench sidewall blocks. In an embodiment, the trench sidewall blocks are insulating blocks (e.g., as described above), and the nucleation layer 431 is deposited on the arms and the bottom of the trapezoidal shaped trenches of the silicon substrate without covering the insulating sidewalls of the trench. In an embodiment, the trench sidewall blocks are metallic blocks (e.g., as described above), and the nucleation layer 431 is deposited on the arms and the bottom of the trapezoidal shaped trenches of the silicon substrate without covering the metallic sidewalls of the trench.

As shown in FIG. 4D, a III-N material layer 438 comprises portions 434 and 437 deposited on the nucleation layer 431 within the trapezoidal trenches. As shown in FIG. 4D, portions 434 and 437 are grown out of the trapezoidal-shaped trenches in a vertical direction (e.g., a c-crystal axis (0001)). In an embodiment, the portions of the III-N material layer are vertically grown on the nucleation layer using a selective area epitaxy, as described above. In an embodiment, III-N material layer 438 represents one of the III-N material layers described herein. In an embodiment, the III-N material layer 438 is a GaN layer.

As shown in FIG. 4D, III-N material layer 438 is laterally grown over the trench sidewall blocks to form coalesced lateral epitaxial overgrowth ("LEO") islands, such as a coalesced LEO island 439. As shown in FIG. 4D, coalesced LEO island 439 comprises a LEO portion 436 adjacent to a LEO portion 435. Portion 436 laterally extends on the sidewall block from vertical portion 437 to merge with portion 435 that laterally extends on the sidewall block from vertical portion 434, as described above.

As shown in FIG. 4D, capping layer 433 is deposited on the III-N material layer 438 to enhance mobility in a two-dimensional electron gas ("2DEG") portion 432 of the III-N material layer 438. In an embodiment, the capping layer 425 represents one of the capping layers described above. As shown in FIG. 4D, device layer 440 is deposited on capping layer 433. In an embodiment, the device layer 440 represents one of the device layers described above. In an embodiment, device contacts are formed over the portions of device layer 440 over the LEO portions of the III-N material layer 438 to form one or more III-N material based devices, as described above.

Figure 5A:
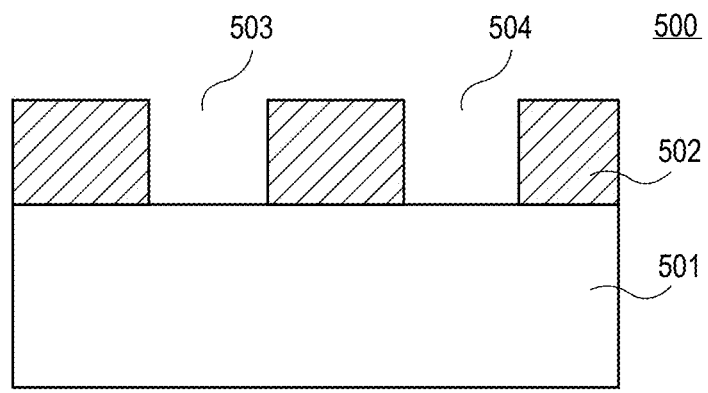
FIG. 5A is a side view of an electronic device structure according to one embodiment.

FIG. 5A is a side view 500 of an electronic device structure according to one embodiment. As shown in FIG. 5A, trenches such as a trench 503 and a trench 504 are formed in a trench layer 502 on a substrate 501. As shown in FIG. 5A, each of the trenches 503 and 504 has a bottom portion and opposing sidewalls. The bottom portion of each trench is a portion of the substrate 501, as described above. In an embodiment, the electronic device structure depicted in FIG. 5A represents the structure depicted in FIG. 2G.

In an embodiment, an etching solution (e.g., tetramethylammonium hydroxide ("TMAH"), potassium hydroxide ("KOH"), ammonium hydroxide ("NH4OH")) is used to anisotropically etch the Si substrate. In an embodiment, a dry etch using gases SF6, XeF2, BCl3, Cl2, or any combination thereof is used to etch the silicon substrate.

Figure 5B:
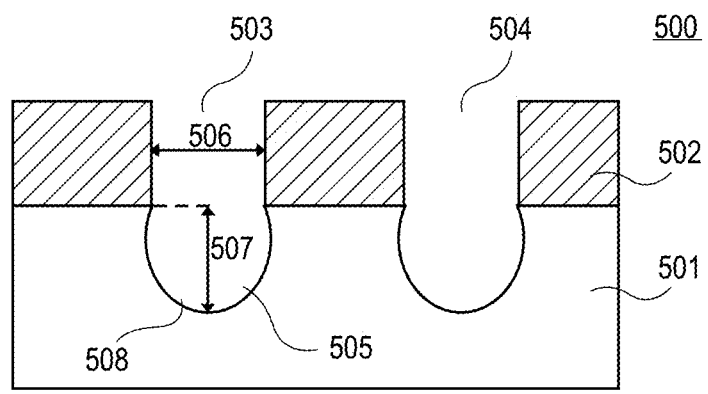
FIG. 5B is a view similar to FIG. 5A after the portions of the substrate within the trenches are etched according to one embodiment.

FIG. 5B is a view 510 similar to FIG. 5A after the portions of the substrate within the trenches are etched according to one embodiment. As shown in FIG. 5B, the bottom portion of the trench 503 comprises a circular trench 508 ("type D trench") formed in substrate 501. As shown in FIG. 5B, a circular trench 508 has a top surface 505 of a substantially circular shape, so that the lattice constant monotonically changes along the surface 505. The monotonic changes of the lattice constant provides a benefit since the lattice mismatch between the nucleation layer and the native substrate is now not fixed, and can result in growth of nucleation layers with lower defect density and better crystalline quality. Also the nucleation layer which grows initially on the substrate as small islands, can result in islands with different orientations and these islands can interact to reduce defects by defect bending and termination. In an embodiment, a depth 507 of the circular trench is from about 30 nm to about 250 nm. In an embodiment, the initial width of the trench which is a distance 503 between the trench sidewall blocks is from about 30 nm to about 10 µm. In an embodiment, the portions of the substrate 401 within trenches are dry etched for a predetermined time using trench sidewall blocks as a mask to form the circular trench.

In an embodiment, the circular trenches are formed by anisotropic dry etching the portions of the substrate 501 using gases SF6, XeF2, BCl3, Cl2, or any combination thereof. In an embodiment, the circular shaped trenches are formed in the silicon substrate by high temperature annealing of the B type trench in hydrogen at a temperature greater than 800° C. to cause reflow of the silicon and form a rounded groove in the silicon substrate.

In one embodiment, the circular trenches are formed by etching the portions of substrate 501 using a wet etching, dry etching, or a both wet etching and dry etching techniques known to one of ordinary skill in the art of electronic device manufacturing.

Figure 5C:
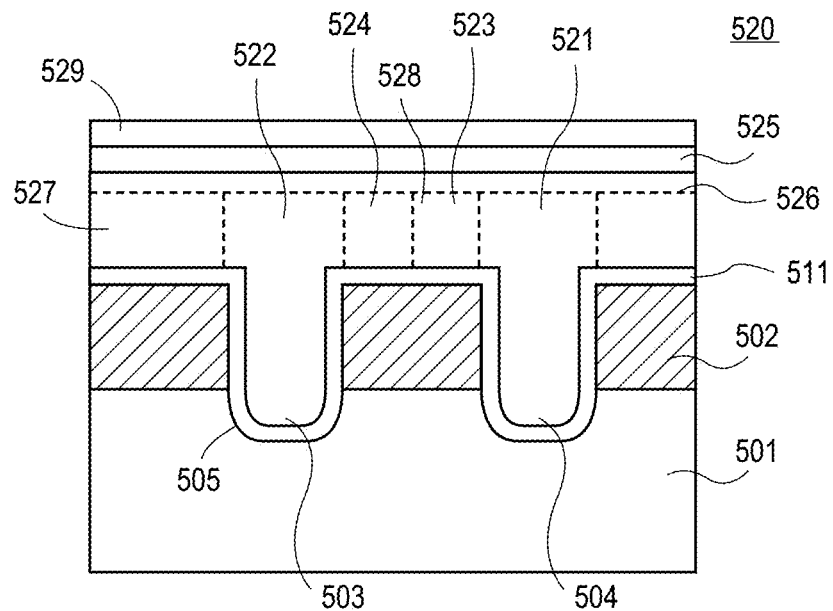
FIG. 5C is a view similar to FIG. 5B, after a device layer is deposited on a capping layer over a III-N material layer on a nucleation layer on the circular trenches of the substrate according to another embodiment.

FIG. 5C is a view similar to FIG. 5B, after a device layer 529 is deposited on a capping layer 525 over a III-N material layer 527 on a nucleation layer 511 on the circular trenches of the substrate according to another embodiment. As shown in FIG. 5C, nucleation layer 511 covers the circular top surfaces, such as surface 505 at the bottom of the trenches 503 and 504 and the trench sidewall blocks. In an embodiment, the trench sidewall blocks are insulating blocks (e.g., silicon oxide), and the nucleation layer 511 is deposited on the circular bottom surfaces of the trenches of the silicon substrate and on the insulating sidewalls of the trench.

As shown in FIG. 5C, a III-N material layer 527 comprises portions 521 and 522 deposited on the nucleation layer 511 within the circular trenches. As shown in FIG. 5C, portions 521 and 522 are grown out of the circular-shaped trenches in a vertical direction (e.g., a c-crystal axis (0001)). In an embodiment, the portions 521 and 522 of the III-N material layer 527 are vertically grown on the nucleation layer using a selective area epitaxy, as described above. In an embodiment, III-N material layer 527 represents one of the III-N material layers described herein. In an embodiment, the III-N material layer 527 is a GaN layer.

As shown in FIG. 5C, III-N material layer 527 is laterally grown over the trench sidewall blocks to form coalesced lateral epitaxial overgrowth ("LEO") islands, such as a coalesced LEO island 528. As shown in FIG. 5C, coalesced LEO island 528 comprises a LEO portion 523 adjacent to a LEO portion 524. Portion 523 laterally extends on the sidewall block from vertical portion 521 to merge with portion 524 that laterally extends on the sidewall block from vertical portion 522, as described above.

As shown in FIG. 5C, capping layer 525 is deposited on the laterally grown III-N material layer 527. In an embodiment, capping layer 525 is deposited to enhance mobility in a two-dimensional electron gas ("2DEG") portion 526 of the III-N material layer 527. In an embodiment, the capping layer 525 represents one of the capping layers described above. In an embodiment, the device layer 529 represents one of the device layers described above. In an embodiment, device contacts are formed over the portions of device layer 529 over the LEO portions of the III-N material layer 527 to form one or more III-N material based devices, as described above.

Figure 5D:
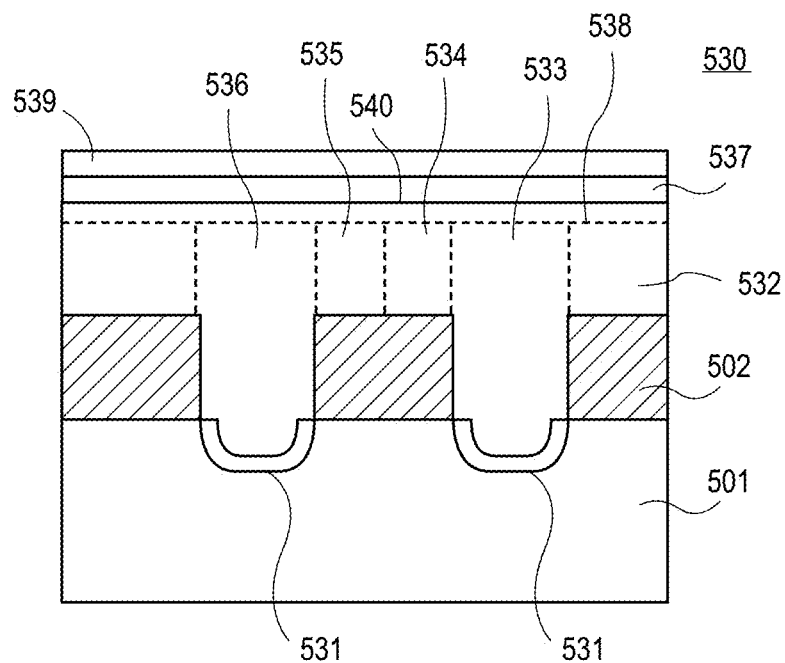
FIG. 5D is a view similar to FIG. 5B, after a device layer is deposited on a capping layer over a III-N material layer over a nucleation layer on the circular trenches of the substrate according to another embodiment.

FIG. 5D is a view similar to FIG. 5B, after a device layer 539 is deposited on a capping layer 537 over a III-N material layer 532 over a nucleation layer 531 on the circular trenches of the substrate according to another embodiment. FIG. 5D is different from FIG. 5C in that the nucleation layer 531 is selectively deposited only on the circular surfaces of trenches, and does not cover the trench sidewall blocks. In an embodiment, the trench sidewall blocks are insulating blocks (e.g., as described above), and the nucleation layer 531 is selectively deposited on the circular surfaces of the trenches in the substrate without covering the insulating sidewalls of the trench. In an embodiment, the trench sidewall blocks are metallic blocks (e.g., as described above), and the nucleation layer 531 is selectively deposited on the circular surfaces of the trenches in the substrate without covering the metallic sidewalls of the trench.

As shown in FIG. 5D, a III-N material layer 532 comprises portions 533 and 536 deposited on the nucleation layer 531 within the circular trenches. As shown in FIG. 5D, portions 533 and 536 are grown out of the circular-shaped trenches in a vertical direction (e.g., a c-crystal axis (0001)). In an embodiment, the portions of the III-N material layer are vertically grown on the nucleation layer using a selective area epitaxy, as described above. In an embodiment, III-N material layer 532 represents one of the III-N material layers described herein. In an embodiment, the III-N material layer 532 is a GaN layer.

As shown in FIG. 5D, III-N material layer 532 is laterally grown over the trench sidewall blocks to form coalesced lateral epitaxial overgrowth ("LEO") islands, such as a coalesced LEO island 540. As shown in FIG. 5D, coalesced LEO island 540 comprises a LEO portion 535 adjacent to a LEO portion 534. Portion 535 laterally extends on the sidewall block from vertical portion 536 to merge with portion 534 that laterally extends on the sidewall block from vertical portion 533, as described above.

As shown in FIG. 5D, capping layer 537 is deposited on the III-N material layer 532 to enhance mobility in a two-dimensional electron gas ("2DEG") portion 538 of the III-N material layer 532. In an embodiment, the capping layer 537 represents one of the capping layers described above. As shown in FIG. 5D, device layer 539 is deposited on capping layer 537. In an embodiment, the device layer 539 represents one of the device layers described above. In an embodiment, device contacts are formed over the portions of device layer 539 over the LEO portions of the III-N material layer 532 to form one or more III-N material based devices, as described above.

FIG. 6A shows a scanning electron microscope ("SEM") image of a type A trench according one embodiment. As shown in FIG. 6A, a STI layer 602 is deposited on a silicon substrate 601. A plurality of type A trenches such as a type A trench 603 are formed in STI layer 602. As shown in FIG. 6A, type A trench 603 has a rectangular shape. The bottom portion of the type A trench is the silicon substrate. Opposing STI sidewalls of the trench 603 are substantially perpendicular to the bottom portion, as described above.

FIG. 6B shows a SEM image 610 of a type B trench according one embodiment. As shown in FIG. 6B, a STI layer 612 is deposited on a silicon substrate 611. A plurality of type B trenches such as a type B trench 613 are formed in STI layer 612. As shown in FIG. 6B, type B trench 613 has a V-shaped bottom portion, and opposing STI sidewalls, as described above. The bottom portion of the type B trench 613 comprises portions 614 and 615 of the substrate 611 aligned along (111) crystal planes that are met forming the V-groove, as described above.

FIG. 6C shows a SEM image 620 of a type C trench according one embodiment. As shown in FIG. 6C, a STI layer 622 is deposited on a silicon substrate 621. A type C trench 623 is formed in STI layer 622. As shown in FIG. 6C, type C trench 623 has a trapezoidal bottom portion, and opposing STI sidewalls, as described above. The bottom portion of the type C trench 623 comprises portions 624 and 625 of the substrate 621 aligned along (111) crystal planes, and a portion 626 of the substrate 621 aligned along a (100) crystal plane, as described above.

FIG. 6D shows a SEM image 630 of a type D trench according one embodiment. As shown in FIG. 6D, a STI layer 632 is deposited on a silicon substrate 631. A type D trench 633 is formed in STI layer 632. As shown in FIG. 6D, type D trench 633 has a circular bottom portion, and opposing STI sidewalls, as described above. The bottom portion of the type D trench 633 comprises a circular shaped surface 634, as described above.

Figure 7:
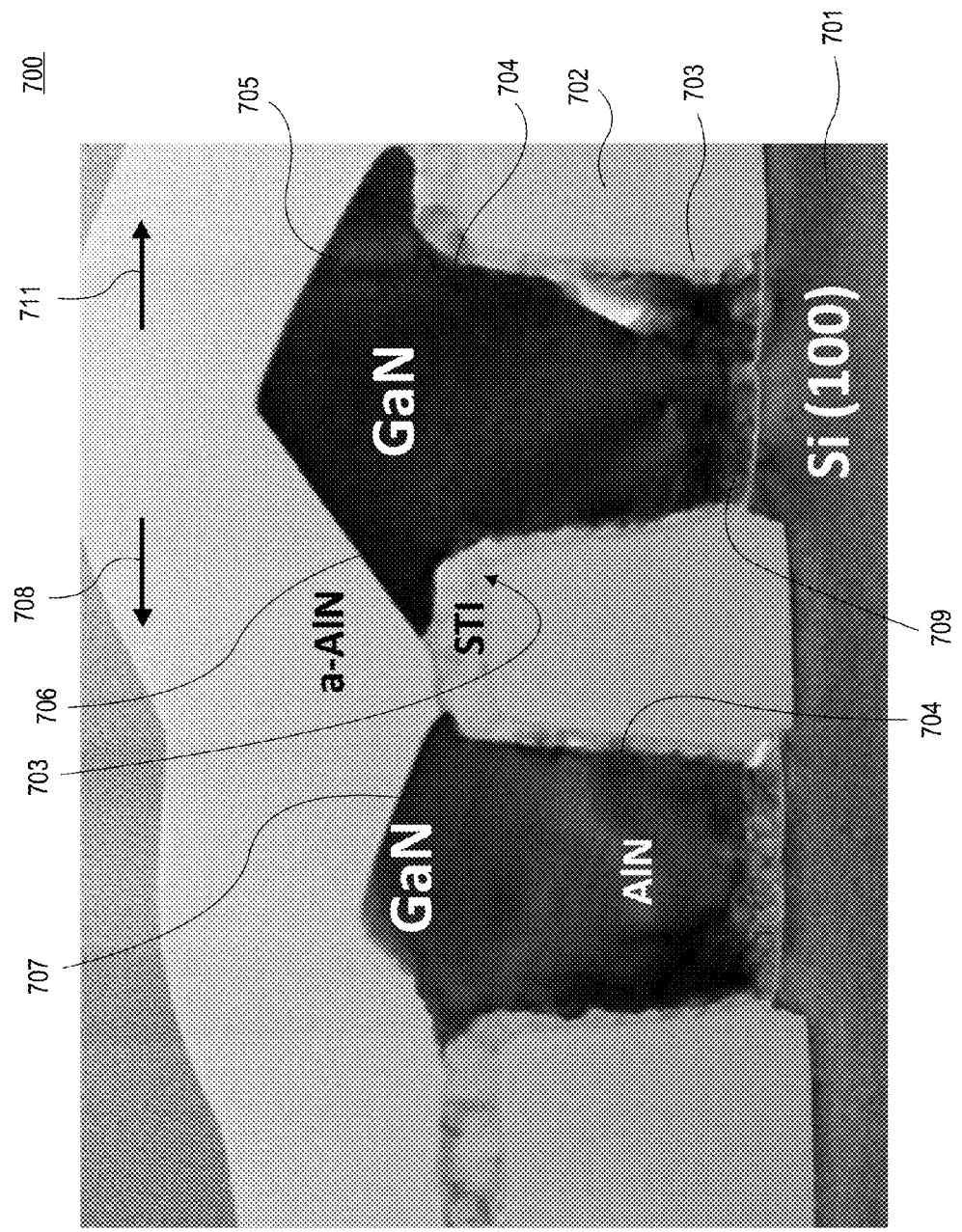
FIG. 7 shows a cross-sectional transmission electron microscope ("XTEM") image of a GaN layer grown from type a trench according to one embodiment.

FIG. 7 shows a cross-sectional transmission electron microscope ("XTEM") image 700 of a GaN layer grown from type A trench according to one embodiment. As shown in FIG. 7, a STI layer 702 is deposited on a silicon (100) substrate 701. A plurality of type A trenches such as a type A trench 703 are formed in STI layer 702. An amorphous AlN nucleation layer 709 is deposited on the bottom of the trenches and on the trench sidewall blocks, as described above. A GaN layer 704 is vertically grown within the trench 703, as described above. A LEO portion 705 of the GaN layer 704 extends in a lateral direction 708 over the trench blocks to merge with a portion 707 of the GaN layer 704 extending in a lateral direction 711 to form a LEO island. A portion 705 of the GaN layer 704 extends in a lateral direction 711 to merge with another LEO portion, as described above.

As shown in FIG. 7, although the AlN layer is amorphous on the STI, the GaN layer grows only out of the trench on top of the AlN on Si, and then starts to laterally expand in both directions 706 and 707. The LEO portions of the GaN layer have significantly less number of dislocation defects comparing with the present state of the art. In an embodiment, due to the underlying oxide body leakage currents of the transistors formed on the portions of the GaN layer are significantly reduced. Various trench designs described above advantageously provide integration of high performance GaN transistors which can be used as voltage regulators, PMIC and RF power amplifiers on Si (100) substrates for SoC applications while maintaining low defect density and zero surface cracks.

Figure 8:
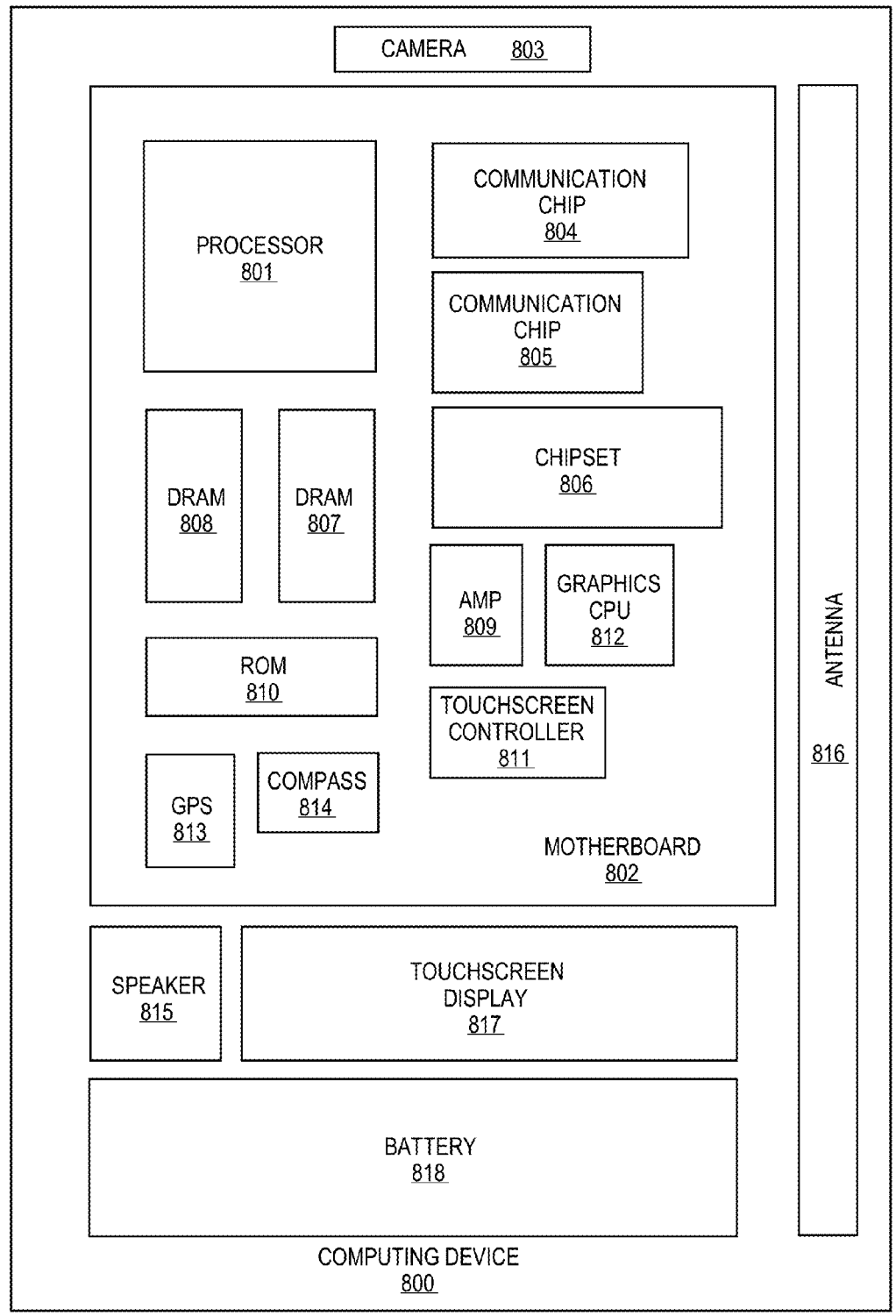
FIG. 8 illustrates a computing device in accordance with one embodiment.

FIG. 8 illustrates a computing device 800 in accordance with one embodiment. The computing device 800 houses a board 802. The board 802 may include a number of components, including but not limited to a processor 801 and at least one communication chip 804. The processor 801 is physically and electrically coupled to the board 802. In some implementations at least one communication chip is also physically and electrically coupled to the board 802. In further implementations, at least one communication chip 804 is part of the processor 801.

Depending on its application, computing device 800 may include other components that may or may not be physically and electrically coupled to the board 802. These other components include, but are not limited to, a memory, such as a volatile memory 808 (e.g., a DRAM), a non-volatile memory 810 (e.g., ROM), a flash memory, a graphics processor 812, a digital signal processor (not shown), a crypto processor (not shown), a chipset 806, an antenna 816, a display, e.g., a touchscreen display 817, a display controller, e.g., a touchscreen controller 811, a battery 818, an audio codec (not shown), a video codec (not shown), an amplifier, e.g., a power amplifier 809, a global positioning system (GPS) device 813, a compass 814, an accelerometer (not shown), a gyroscope (not shown), a speaker 815, a camera 803, and a mass storage device (such as hard disk drive, compact disk (CD), digital versatile disk (DVD), and so forth) (not shown).

A communication chip, e.g., communication chip 804, enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 804 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips. For instance, a communication chip 804 may be dedicated to shorter range wireless communications such as Wi-Fi and Bluetooth and a communication chip 836 may be dedicated to longer range wireless communications such as GPS, EDGE, GPRS, CDMA, WiMAX, LTE, Ev-DO, and others.

In at least some embodiments, the processor 801 of the computing device 800 includes an integrated circuit die having III-N devices co-integrated with Si CMoS devices on a silicon wafer as described herein. The integrated circuit die of the processor includes one or more devices, such as transistors, RF power amplifier, capacitor, metal interconnects, or other III-N devices co-integrated with Si CMoS devices as described herein. The term "processor" may refer to any device or portion of a device that processes electronic data from registers and/or memory to transform that electronic data into other electronic data that may be stored in registers and/or memory. The communication chip 805 also includes an integrated circuit die having III-N devices co-integrated with Si CMoS devices on a silicon wafer according to the embodiments described herein.

In further implementations, another component housed within the computing device 800 may contain an integrated circuit die having III-N devices co-integrated with Si CMoS devices on a silicon wafer according to embodiments described herein.

In accordance with one implementation, the integrated circuit die of the communication chip includes one or more devices, such as transistors and metal interconnects, as described herein. In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The following examples pertain to further embodiments:

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, and depositing a device layer on the laterally grown III-N material layer.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, wherein the III-N material layer comprises gallium nitride, and the substrate comprises silicon.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, wherein the trench has an insulating sidewall.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, wherein the trench has a metallic sidewall.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, wherein the nucleation layer comprises aluminum nitride, a polycrystalline III-N material, an amorphous III-N material, or any combination thereof.

A method to manufacture an electronic device, comprising forming a trench comprising a first portion of a substrate, depositing a nucleation layer on the first portion of the substrate within the trench, and depositing a III-N material layer on the nucleation layer, wherein the III-N material layer is laterally grown over the trench, wherein forming the trench comprises depositing an insulating layer on the substrate; patterning the insulating layer; etching the patterned insulating layer to expose a second portion of the substrate; depositing a trench layer on the second portion of the substrate; and removing the insulating layer.

A method to manufacture an electronic device, comprising forming a trench comprising a first portion of a substrate, depositing a nucleation layer on the first portion of the substrate within the trench, depositing a III-N material layer on the nucleation layer, wherein the III-N material layer is laterally grown over the trench, and etching the first portion of the substrate to form at least one of a V-shaped trench, a trapezoidal trench, or a circular trench.

A method to manufacture an electronic device comprising forming a plurality of trenches on a substrate, depositing a nucleation layer on the substrate within the trenches, depositing a III-N material layer on the nucleation layer, and laterally growing the III-N material layer over the trenches.

A method to manufacture an electronic device comprising forming a plurality of trenches on a substrate, depositing a nucleation layer on the substrate within the trenches, depositing a III-N material layer on the nucleation layer, and laterally growing the III-N material layer over the trenches, wherein portions of the III-N material layer laterally grown over the trenches are merged to form an island.

A method to manufacture an electronic device comprising forming a plurality of trenches on a substrate, depositing a nucleation layer on the substrate within the trenches, depositing a III-N material layer on the nucleation layer, laterally growing the III-N material layer over the trenches, and depositing a device layer on the laterally grown III-N material layer.

A method to manufacture an electronic device comprising forming a plurality of trenches on a substrate, depositing a nucleation layer on the substrate within the trenches, depositing a III-N material layer on the nucleation layer, and laterally growing the III-N material layer over the trenches, wherein forming the plurality of trenches comprises depositing an insulating layer on the substrate, patterning the insulating layer, etching the patterned insulating layer; depositing a trench layer on the patterned insulating layer; and removing the insulating layer.

A method to manufacture an electronic device comprising forming a plurality of trenches on a substrate, depositing a nucleation layer on the substrate within the trenches, depositing a III-N material layer on the nucleation layer, laterally growing the III-N material layer over the trenches, and etching portions of the substrate within the trenches to form at least one of a V-shaped trench, a trapezoidal trench, or a circular trench.

A method to manufacture an electronic device comprising forming a plurality of trenches on a substrate, depositing a nucleation layer on the substrate within the trenches, depositing a III-N material layer on the nucleation layer, and laterally growing the III-N material layer over the trenches, wherein the substrate comprises a Si (100) substrate.

An electronic device, comprising a plurality of trenches on a substrate, a nucleation layer on the substrate within the trenches, and a III-N material layer on the nucleation layer, wherein the III-N material layer extends laterally over the trenches.

An electronic device, comprising a plurality of trenches on a substrate, a nucleation layer on the substrate within the trenches, a III-N material layer on the nucleation layer, wherein the III-N material layer extends laterally over the trenches, and a device layer on the laterally extended III-N material layer.

An electronic device, comprising a plurality of trenches on a substrate, a nucleation layer on the substrate within the trenches, and a III-N material layer on the nucleation layer, wherein the III-N material layer extends laterally over the trenches, wherein the III-N material layer comprises GaN and the substrate comprises a silicon (100) substrate.

An electronic device, comprising a plurality of trenches on a substrate, a nucleation layer on the substrate within the trenches, and a III-N material layer on the nucleation layer, wherein the III-N material layer extends laterally over the trenches, wherein the trench has an insulating sidewall.

An electronic device, comprising a plurality of trenches on a substrate, a nucleation layer on the substrate within the trenches, and a III-N material layer on the nucleation layer, wherein the III-N material layer extends laterally over the trenches, wherein the trench has a metallic sidewall.

An electronic device, comprising a plurality of trenches on a substrate, a nucleation layer on the substrate within the trenches, and a III-N material layer on the nucleation layer, wherein the III-N material layer extends laterally over the trenches, wherein the nucleation layer comprises aluminum nitride, a polycrystalline III-N material, an amorphous III-N material, or any combination thereof.

An electronic device, comprising a plurality of trenches on a substrate, a nucleation layer on the substrate within the trenches, and a III-N material layer on the nucleation layer, wherein the III-N material layer extends laterally over the trenches, wherein the trench is at least one of a rectangular trench, a V-shaped trench, a trapezoidal trench, or a circular trench.

An electronic device, comprising a plurality of trenches on a substrate, a nucleation layer on the substrate within the trenches, and a III-N material layer on the nucleation layer, wherein the III-N material layer extends laterally over the trenches, wherein portions of the III-N material layer laterally grown over the trenches are merged into an island.

An electronic device, comprising a plurality of trenches on a substrate, a nucleation layer on the substrate within the trenches, and a III-N material layer on the nucleation layer, wherein the III-N material layer extends laterally over the trenches, wherein the thickness of the nucleation layer is from 10 nanometers to 700 nanometers.

An electronic device, comprising a plurality of trenches on a substrate, a nucleation layer on the substrate within the trenches, and a III-N material layer on the nucleation layer, wherein the III-N material layer extends laterally over the trenches, wherein the width of the trenches is from 50 nanometers to 1 micron.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A method to manufacture an electronic device, comprising:
   forming a trench in a trench layer on a substrate, the trench comprising a bottom that is a first portion of the substrate and a sidewall extending in a vertical direction from the substrate to a top surface of the trench layer;
   etching the first portion of the substrate to form a faceted surface that is one of a V-groove or a rounded surface;
   depositing a nucleation layer on the faceted surface of the substrate within the trench; and
   growing a III-N material layer on the nucleation layer from the bottom of the trench to a top portion of the trench layer in the vertical direction, wherein the vertically grown III-N material layer is laterally grown on the top portion of the trench layer.

2. The method of claim 1, further comprising
   depositing a device layer on the laterally grown III-N material layer.

3. The method of claim 1, wherein the III-N material layer comprises gallium nitride, and the substrate comprises silicon.

4. The method of claim 1, wherein the trench layer is an insulating layer.

5. The method of claim 1, wherein the trench layer is a metallic layer.

6. The method of claim 1, wherein the nucleation layer comprises aluminum nitride, a polycrystalline III-N material, an amorphous III-N material, or any combination thereof.

7. The method of claim 1, wherein forming the trench comprises
   depositing an insulating layer on the substrate;
   patterning the insulating layer;
   etching the patterned insulating layer to expose a second portion of the substrate;
   depositing the trench layer on the second portion of the substrate; and removing the insulating layer.

8. The method of claim 1, wherein the depth of the V-groove is $7/10^{th}$ of the width of the trench.

9. A method to manufacture an electronic device comprising:
   forming a plurality of trenches in a trench layer on a substrate;
   etching portions of the substrate within the trenches to form faceted surfaces, wherein each of the faceted surfaces is one of a V-groove or a rounded surface;
   depositing a nucleation layer on the faceted surfaces of the substrate within the trenches;
   growing a III-N material layer on the nucleation layer from the bottom of the trenches to a top portion of the trench layer in a vertical direction; and
   laterally growing the vertically grown III-N material layer on the top portion of the trench layer.

10. The method of claim 9, wherein portions of the laterally grown III-N material layer are merged to form an island.

11. The method of claim 9, further comprising
    depositing a device layer on the laterally grown III-N material layer.

12. The method of claim 9, wherein forming the plurality of trenches comprises
    depositing an insulating layer on the substrate;
    patterning the insulating layer;
    etching the patterned insulating layer;
    depositing the trench layer on the patterned insulating layer; and
    removing the insulating layer.

13. The method of claim 9, wherein the depth of the V-groove is $7/10^{th}$ of the width of the trench.

14. The method of claim 9, wherein the substrate comprises a Si (100) substrate.

* * * * *